(12) United States Patent
Lee et al.

(10) Patent No.: US 11,984,365 B2
(45) Date of Patent: May 14, 2024

(54) SEMICONDUCTOR STRUCTURE INSPECTION USING A HIGH ATOMIC NUMBER MATERIAL

(71) Applicant: Taiwan Semiconductor Manufacturing Company, Ltd., Hsinchu (TW)

(72) Inventors: Pei-Hsuan Lee, Taipei (TW); Hung-Ming Chen, New Taipei (TW); Kuang-Shing Chen, Hsinchu (TW); Yu-Hsiang Cheng, New Taipei (TW); Xiaomeng Chen, Baoshan Township (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 315 days.

(21) Appl. No.: 17/249,965

(22) Filed: Mar. 19, 2021

(65) Prior Publication Data

US 2022/0301944 A1    Sep. 22, 2022

(51) Int. Cl.
*H01L 21/00* (2006.01)
*G01N 23/2251* (2018.01)
*H01L 21/02* (2006.01)
*H01L 21/66* (2006.01)

(52) U.S. Cl.
CPC ......... *H01L 22/12* (2013.01); *G01N 23/2251* (2013.01); *H01L 21/02181* (2013.01); *H01L 21/02192* (2013.01)

(58) Field of Classification Search
CPC .............. H01L 22/12; H01L 21/02181; H01L 21/02192; G01N 23/2251
See application file for complete search history.

(56) References Cited

U.S. PATENT DOCUMENTS

| | | | | |
|---|---|---|---|---|
| 2004/0248362 A1* | 12/2004 | Nakamura | ........... | H10B 12/033 257/307 |
| 2007/0001238 A1* | 1/2007 | Koyama | ......... | H01L 21/823842 257/407 |
| 2021/0280386 A1* | 9/2021 | Brodie | .................. | H01J 37/226 |

* cited by examiner

*Primary Examiner* — Victor A Mandala
*Assistant Examiner* — Colleen E Snow
(74) *Attorney, Agent, or Firm* — Harrity & Harrity, LLP

(57) ABSTRACT

A high atomic number material is applied to one or more surfaces of a semiconductor structure of a wafer. The one or more surfaces are at a depth different from a depth of a surface of the wafer. An electron beam is scanned over the semiconductor structure to cause a backscattered electron signal to be collected at a collector. A profile scan of the semiconductor structure is generated based on an intensity of the backscattered electron signal, at the collector, resulting from the high atomic number material. The high atomic number material increases the intensity of the backscattered electron signal for the one or more surfaces of the semiconductor structure such that contrast in the profile scan is increased. The increased contrast of the profile scan enables accurate critical dimension measurements of the semiconductor structure.

20 Claims, 18 Drawing Sheets

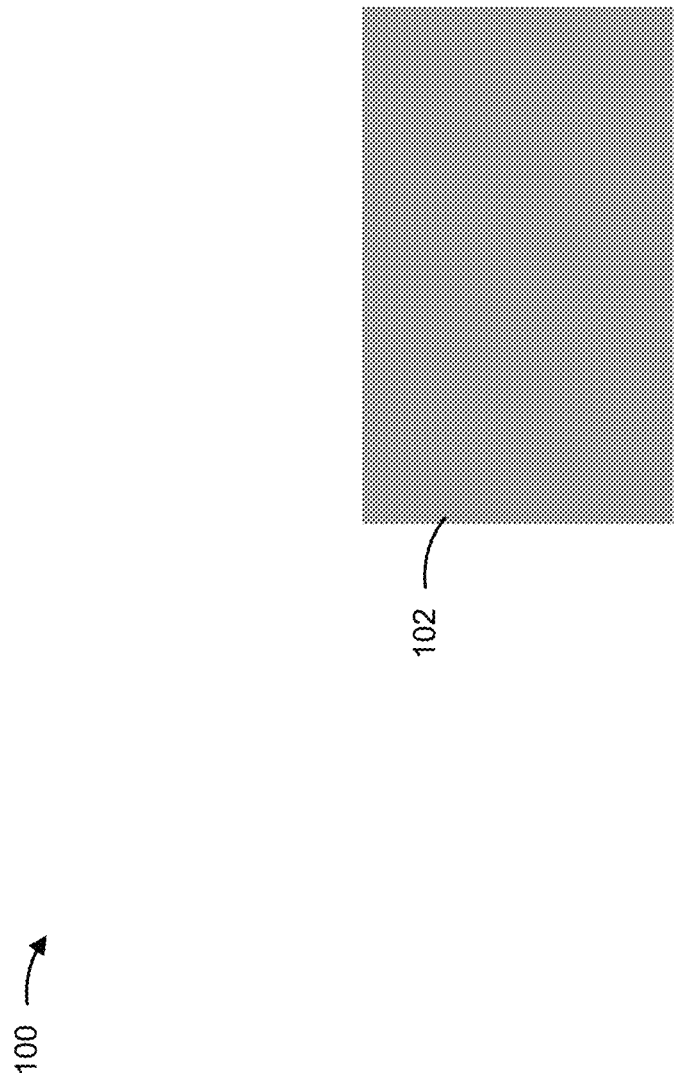

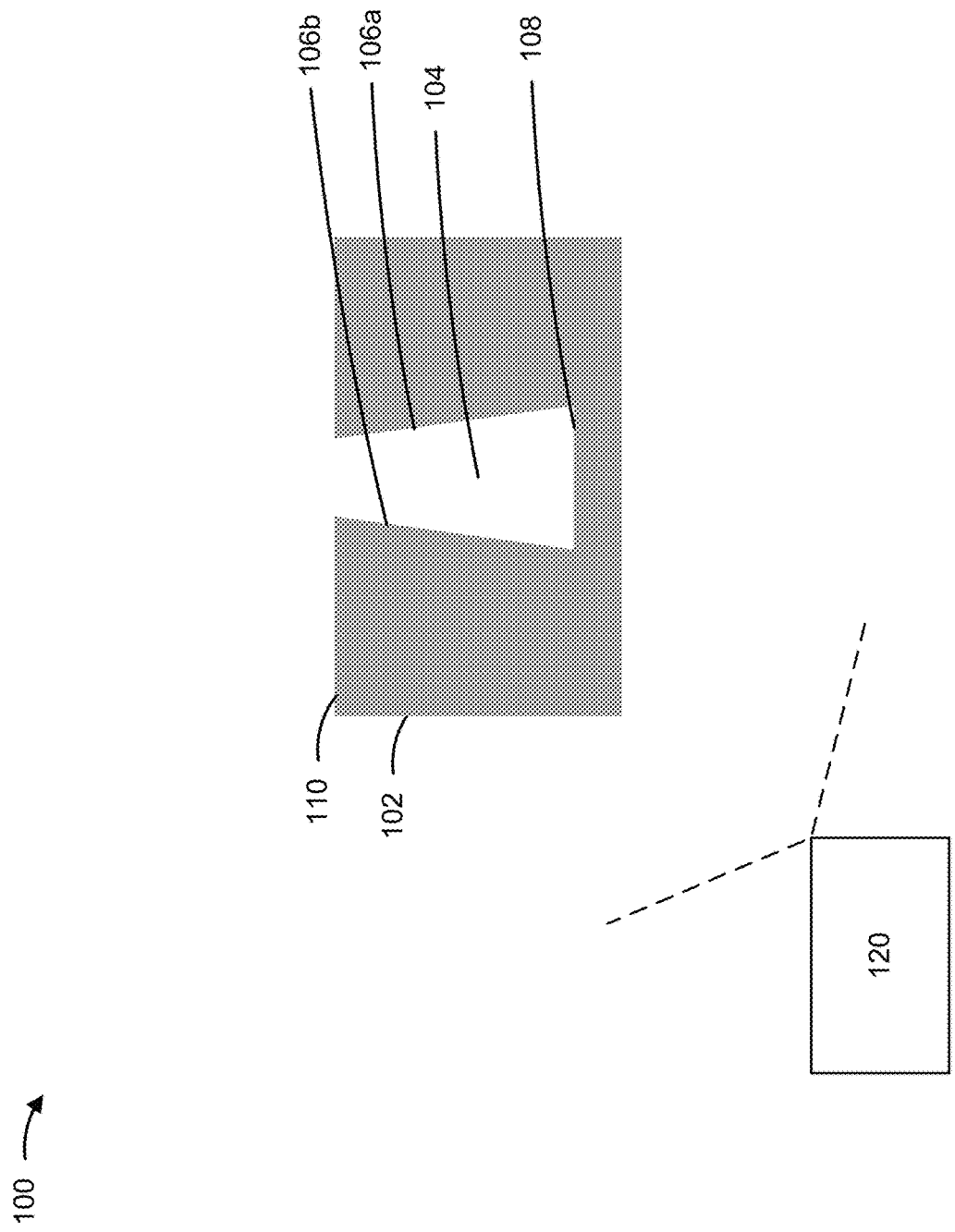

SEMICONDUCTOR STRUCTURE INSPECTION USING A HIGH ATOMIC NUMBER MATERIAL

BACKGROUND

Semiconductor integrated circuit technology has experienced rapid progress including the continued minimization of feature sizes and the maximization of packing density. Feature size minimization relies on improvement in photolithography and the associated ability to print smaller features or critical dimensions (CD). As critical dimension sizes continue to decrease, quality control is increasingly used to maintain yield and refine processing techniques. Quality control for smaller critical dimensions can be facilitated through stringent wafer inspection for defects and other processing issues.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1A-1H are diagrams of one or more example implementations described herein.

DETAILED DESCRIPTION

Figure 1C:
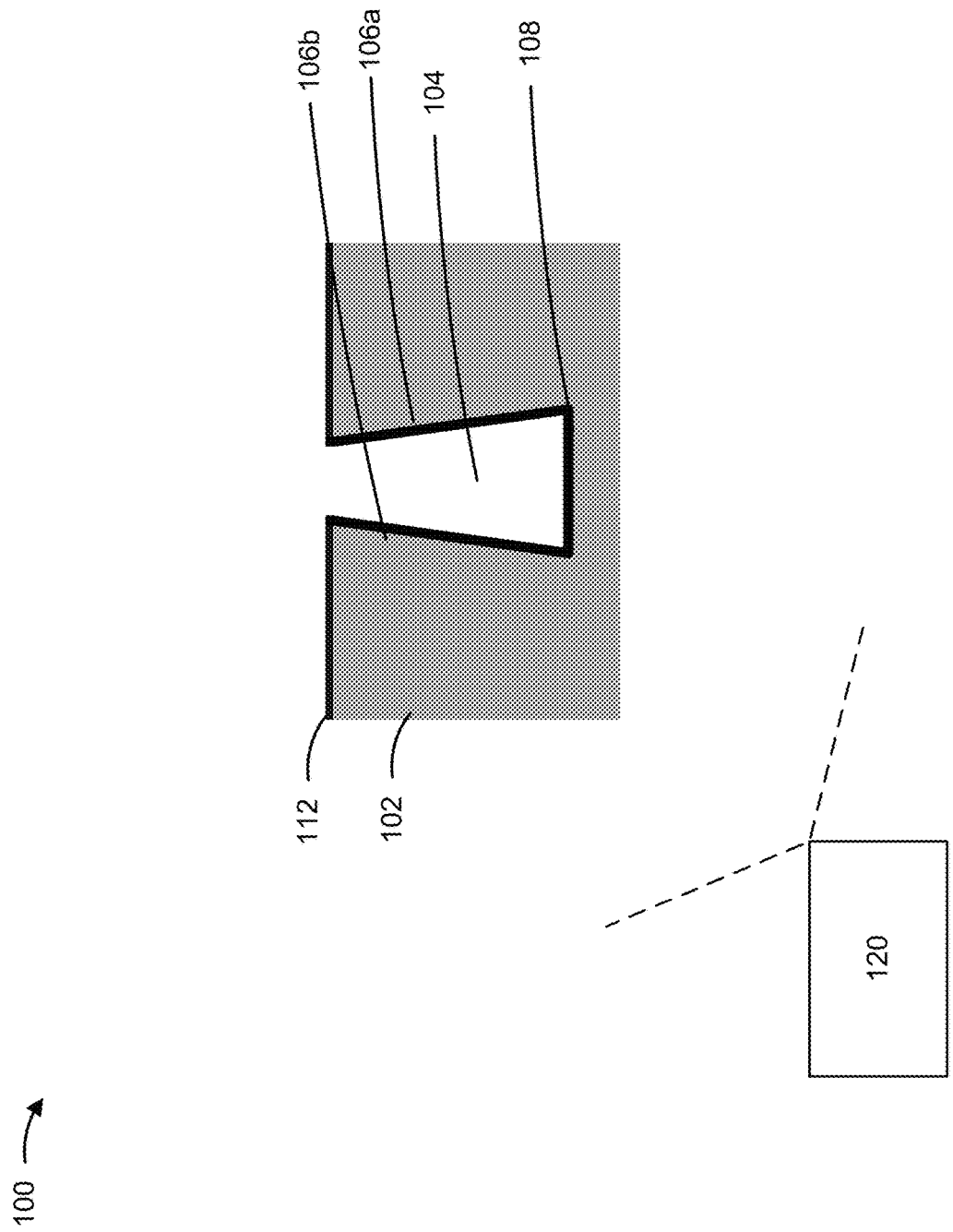

The following disclosure provides many different implementations, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include implementations in which the first and second features are formed in direct contact, and may also include implementations in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various implementations and/or configurations discussed.

Further, spatially relative terms, such as "beneath," "below," "lower," "above," "upper," and/or the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

One technique that can be used to identify defects includes using an electron microscope to inspect a semiconductor structure formed on a wafer. The wafer is placed in a vacuum chamber, and the electron microscope emits an electron beam of electrons onto the wafer. The electrons contact the various materials of the wafer and the semiconductor structure thereon, which causes the atoms of the materials to backscatter electrons from the electron beam. The backscattered electrons form a backscattered electron signal that is collected at a collector of the electron microscope. A computer or another type of scan processing device receives the backscattered electron signal from the collector and generates a two-dimensional or three-dimensional scan or image of the wafer and semiconductor structure based on localized intensity of the backscattered electron signal as the electron beam is scanned over the wafer. Critical dimensions of the semiconductor structure may be measured from the resulting scan or image to verify processing tolerances and to identify defects.

While the use an electron microscope to identify defects in a semiconductor structure provides many benefits in semiconductor manufacturing, some limitations exist in current processing techniques. For example, an electron microscope may be unable to generate a scan or image of a semiconductor structure with sufficient contrast to perform critical dimension measurements of the semiconductor structure if the difference in depth between a surface of the semiconductor structure and a surface of the wafer is too great. This can occur, for example, where the semiconductor structure is formed beneath or above the surface of the wafer. The difference in depth between the surface of the semiconductor structure and the surface of the wafer causes the signal intensity of the backscattered electron signal generated from the surface of the semiconductor structure, which in turn results in dark images or low contrast in areas where critical dimension measurements are to be performed.

According to some implementations described herein, a semiconductor structure may be formed on a wafer such that a surface of the semiconductor structure is at a different depth relative to a depth of a surface of the wafer. For example, the semiconductor structure may be formed beneath and/or above the surface of the wafer. The semiconductor structure may be further processed to apply a high atomic number material on the surface of the semiconductor structure. The high atomic number material is made up of relatively larger atoms compared to the material(s) of the surfaces of the wafer and the semiconductor structure. The larger atoms of the high atomic number material more easily scatter electrons relative to the material(s) of the surfaces of the wafer and the semiconductor structure, which produces a higher intensity backscattered electron signal relative to the material(s) of the surfaces of the wafer and the semiconductor structure. The higher intensity backscattered electron signal produces an increased brightness and/or higher contrast in electron microscope scans or images than if no high atomic number material were used. In this way, the scans or images may be used for more accurate critical dimension measurements, may be used for critical dimension measurement of a semiconductor structure beneath and/or above the surface of the wafer, and may be used for analysis of gray level profiles of a semiconductor structure to define pattern dimensions or a profile of the semiconductor structure.

FIGS. 1A-1H are diagrams of one or more example implementations 100 described herein. As shown in FIGS. 1A-1H, example implementation(s) 100 include various techniques for processing and inspecting a wafer 102 and a semiconductor structure 104 formed therein using a high atomic number material.

Turning to FIG. 1A, wafer 102 may include a wafer formed of various semiconducting, insulating, and/or conductive materials. For example, wafer 102 may be formed of a crystalline silicon, a compound III-V semiconductor material such as gallium arsenide (GaAs) or gallium nitride (GaN), and/or other materials. In some implementations, wafer 102 may be referred to as a substrate or another structure on and/or in which a semiconductor structure may be formed.

As shown in FIG. 1B, semiconductor structure 104 may be formed in wafer 102. Semiconductor structure 104 may be a semiconductor device such as a transistor; may be a portion of a semiconductor device such as a contact, a transistor gate, a source, or a drain; may be a via, or may be another type of semiconductor structure. Semiconductor structure 104 may be composed of one or more surfaces. As shown in FIG. 1B, semiconductor structure 104 may include a plurality of surfaces: side surfaces 106a and 106b, and a bottom surface 108. Semiconductor structure 104 may be formed below or beneath a surface 110 (e.g., a top surface or outer surface) of wafer 102. In this case, surfaces 106a, 106b, and 108 may be located beneath or below surface 110 of wafer 102, and are therefore at a different depth relative to the depth of surface 110. While semiconductor structure 104 is shown in example implementation(s) 100 as a reverse trapezoidal shape, other semiconductor structures 104 may be formed with a different shape and/or a different quantity and/or configuration of surfaces.

Semiconductor structure 104 may be formed using various semiconductor processing techniques and semiconductor processing devices 120, such as etching from the surface 110 of wafer 102 down to a particular depth within wafer 102. For example, a semiconductor processing device 120 may form, deposit, grow, or otherwise apply a photoresist material to surface 110 of wafer 102, a semiconductor processing device 120 may expose the photoresist to create a patterned photomask, and a semiconductor processing device 120 may etch surface 110 down into wafer 102 to form semiconductor structure 104. Various etching techniques may be used, such as wet or liquid etching, dry or plasma etching, and/or another etching technique.

As shown in FIG. 1C, a semiconductor processing device 120 may apply a high atomic number material 112 to at least a portion of wafer 102 such that surfaces 106a, 106b, and 108 of semiconductor structure 104 are coated or covered by high atomic number material 112. In some implementations, a semiconductor processing device 120 deposits high atomic number material 112 as a film to at least a portion of wafer 102 such that the film is deposited on surfaces 106a, 106b, and 108 of semiconductor structure 104. In some implementations, a semiconductor processing device 120 grows high atomic number material 112 on surfaces 106a, 106b, and 108 of semiconductor structure 104 via epitaxy or another growing technique. In some implementations, a semiconductor processing device 120 creates high atomic number material 112 on surfaces 106a, 106b, and 108 of semiconductor structure 104 via ion implantation.

High atomic number material 112 may include a material having a higher or substantially higher atomic number relative to the material of wafer 102, the material of surface 110, and/or the material of surfaces 106a, 106b, and 108. Example high atomic number materials include hafnium (or a hafnium oxide), lanthanum (or a lanthanum oxide), zirconium (or a zirconium oxide), and/or another material having relatively large atoms compared to the material of wafer 102, the material of surface 110, and/or the material of surfaces 106a, 106b, and 108.

The semiconductor processing device 120 may apply high atomic number material 112 to surfaces 106a, 106b, and 108 such that the thickness of high atomic number material 112 is substantially uniform. The uniformity of the thickness of high atomic number material 112 may impact critical dimension measurement of semiconductor structure 104. By applying high atomic number material 112 in a uniform manner, the characteristics of surfaces 106a, 106b, and 108 are preserved, which ensures accurate critical dimension measurement. An example thickness of high atomic number material 112 applied to surfaces 106a, 106b, and 108 is in a range from approximately 1 nanometer (nm) to approximately 2 nm.

Figure 1D:
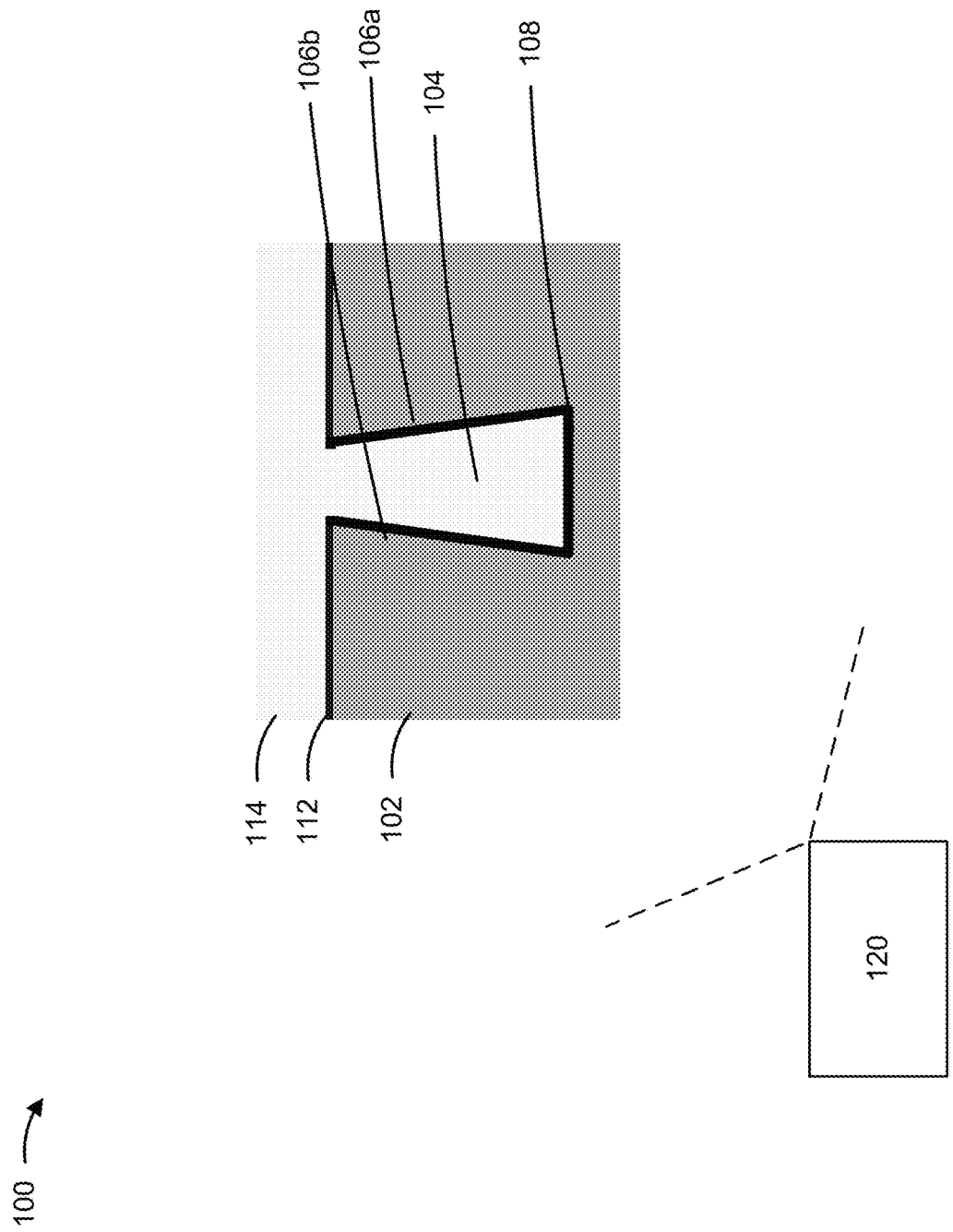

As shown in FIG. 1D, a semiconductor processing device 120 may backfill semiconductor structure 104 by depositing a material 114 in semiconductor structure 104 to cover high atomic number material 112 and surfaces 106a, 106b, and 108. Material 114 may include a dielectric material, a non-conductive material, or an insulating material. Material 114 may include a material having a lower or substantially lower atomic number relative to high atomic number material 112.

Figure 1E:
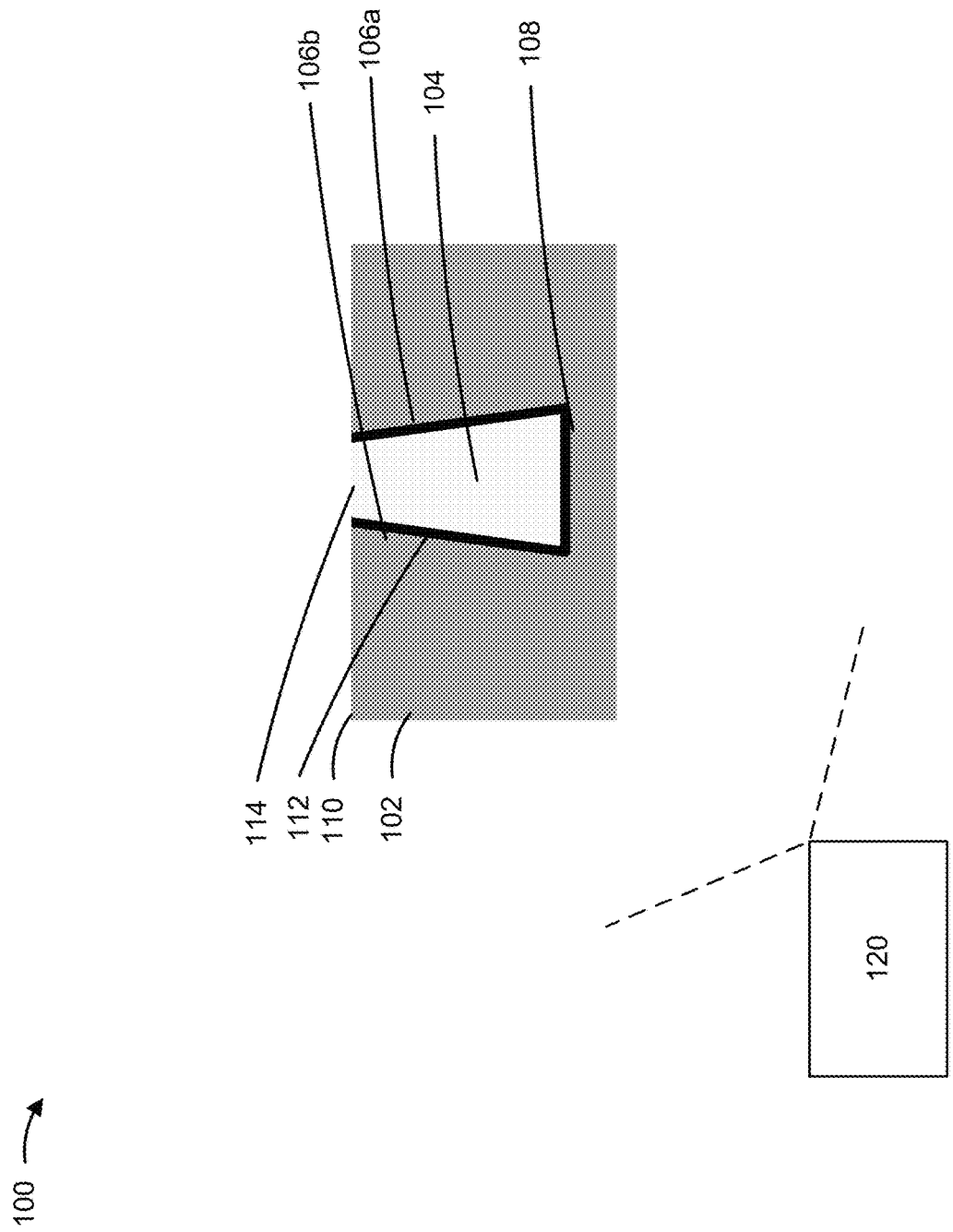

In some cases, high atomic number material 112 and/or material 114 may be applied to at least a portion of surface 110 of wafer (e.g., as a process byproduct). In these cases, and as shown in FIG. 1E, a semiconductor processing device 120 may remove high atomic number material 112 and/or material 114 from surface 110. The semiconductor processing device 120 may use various material removal techniques, including polishing surface 110 using a chemical-mechanical polishing, using a planarization technique to planarize surface 110, and/or other material removal techniques.

In some implementations, the processing steps and/or techniques illustrated and described above in connection with FIGS. 1A-1E are used to form semiconductor structure 104 and/or prepare semiconductor structure 104 for inspection. In some implementations, more processing steps or techniques may be used to form semiconductor structure 104 and/or prepare semiconductor structure 104 for inspection than those illustrated and described above in connection with FIGS. 1A-1E. In some implementations, different steps or techniques than those described above in connection with FIGS. 1A-1E may be used to form semiconductor structure 104 and/or prepare semiconductor structure 104 for inspection.

Figure 1F:
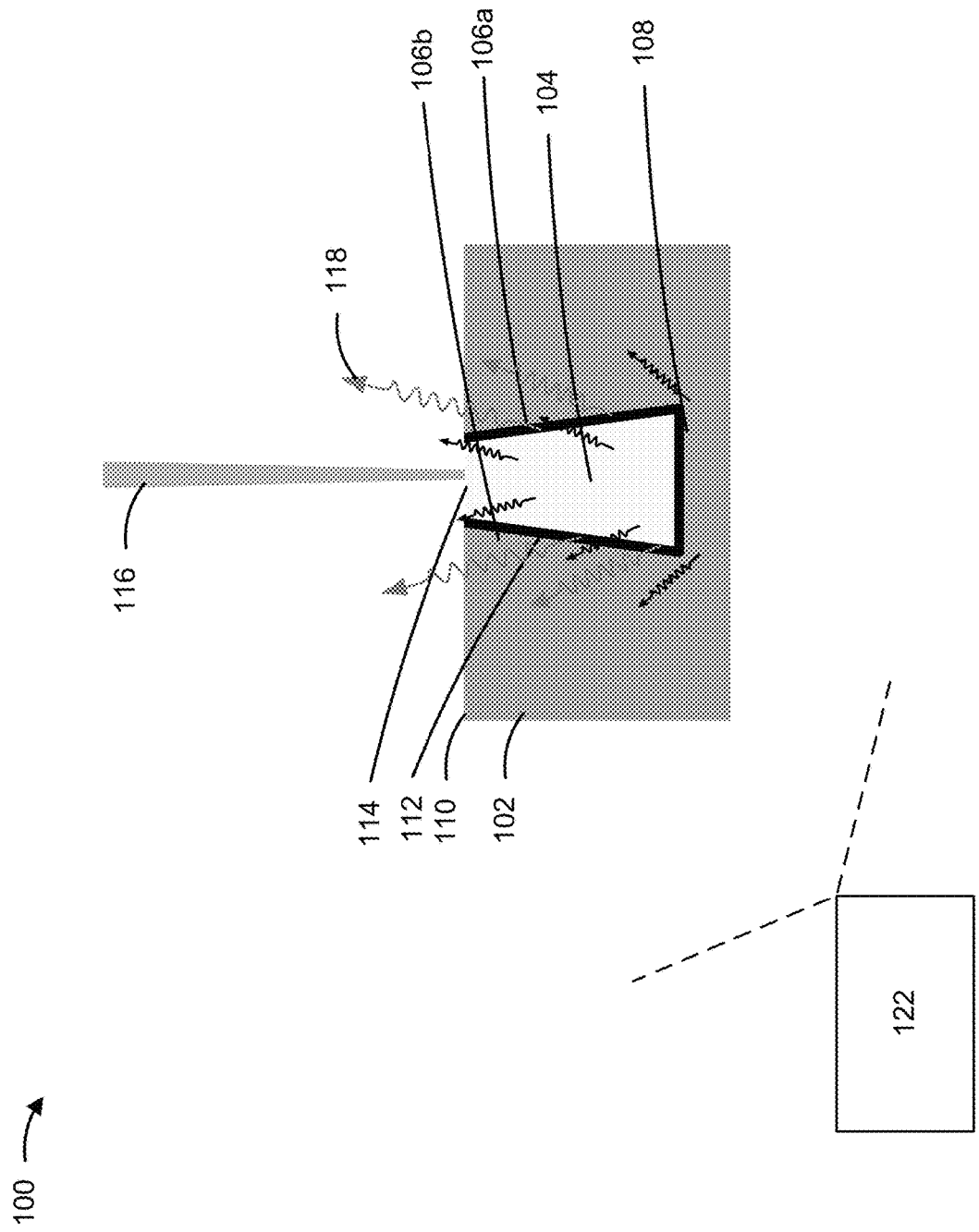

As shown in FIG. 1F, an electron microscope 122 may be used to inspect semiconductor structure 104 after high atomic number material 112 has been applied to semiconductor structure 104. To inspect semiconductor structure 104, the electron microscope 122 may generate and emit an electron beam 116 via an emitter of the electron microscope 122. Electron beam 116 includes a charged and focused electron beam of primary electrons that is directed at wafer 102 and semiconductor structure 104. Electron beam 116 may be directed into a vacuum chamber in which wafer 102 is located, and directed onto wafer 102 and semiconductor structure 104.

As further shown in FIG. 1F, electron beam 116 may contact surface 110, high atomic number material 112 on surfaces 106a, 106b, and 108, and material 114. Electron beam 116 may cause backscattered electrons 118 to be scattered from surface 110, from high atomic number material 112 on surfaces 106a, 106b, and 108, and from material 114. Backscattered electrons 118 may form a backscattered electron signal (e.g., a stream or flow of electrons) that is collected at a collector of the electron microscope 122. As further shown in FIG. 1F, high atomic number material 112 emits a higher intensity backscattered electron signal (e.g., emits a greater quantity and/or density of backscattered electrons 118) relative to the materials of wafer 102 and material 114.

Figure 1G:
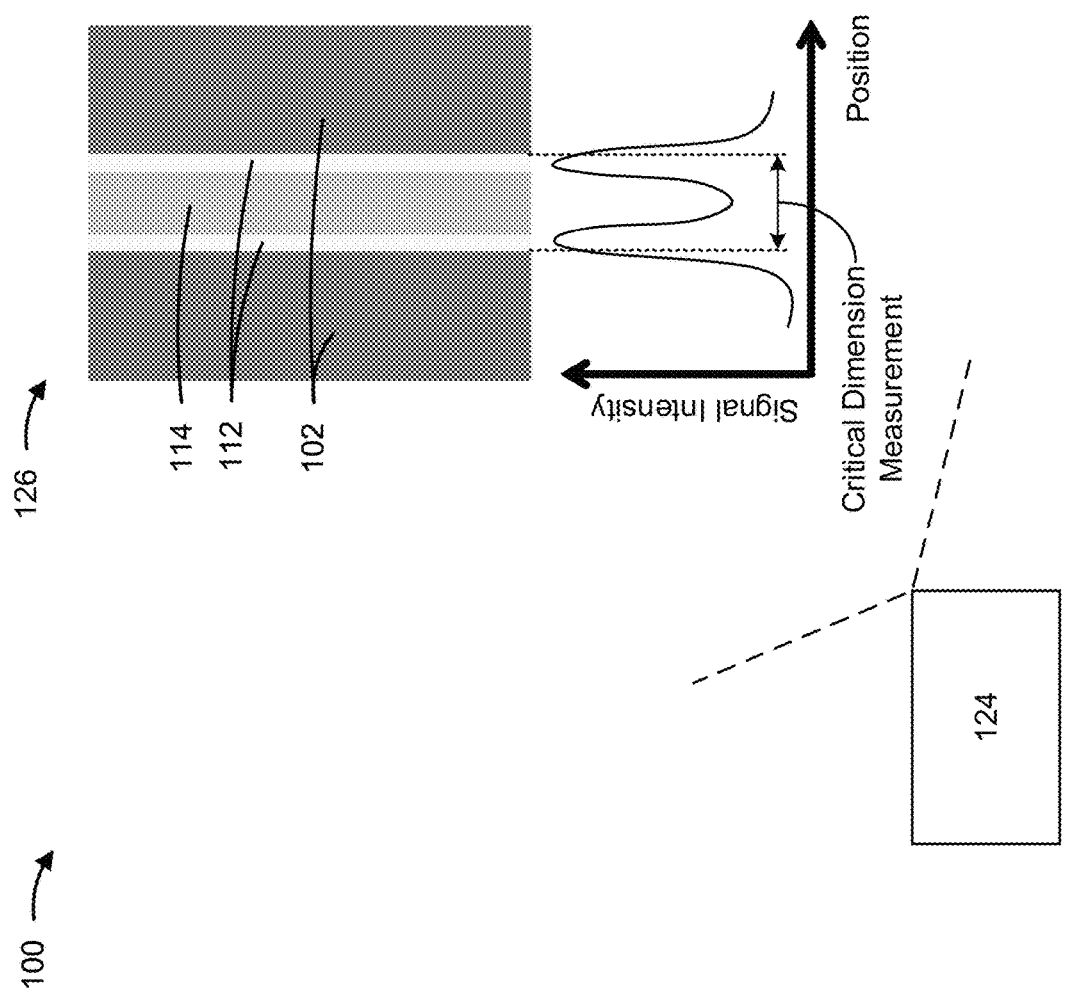

As shown in FIG. 1G, the backscattered electron signal collected at the collector of the electron microscope 122 may be provided to a scan processing device 124. The scan processing device 124 may generate a profile scan 126 or image based on the received backscattered electron signal. Profile scan 126 may be a two-dimensional scan or image, or may be a three-dimensional scan or image.

In some implementations, the scan processing device 124 generates profile scan 126 as the electron microscope 122 scans wafer 102 and semiconductor structure 104. The electron microscope 122 may scan wafer 102 and semiconductor structure 104 in a raster pattern or another type of scanning pattern. The scan processing device 124 may generate profile scan 126 in a similar manner. For example, the scan processing device 124 may generate profile scan 126 in the same pattern that is used to scan wafer 102 and semiconductor structure 104 with electron beam 116.

The scan processing device 124 may generate profile scan 126 based on the signal intensity of the backscattered electron signal. For example, the scan processing device 124 may determine a brightness or intensity for each portion of profile scan 126 based on the signal intensity of the backscattered electron signal at a corresponding position of electron beam 116 on wafer 102 or semiconductor structure 104. The pitch of profile scan 126 (e.g., the size of each portion of profile scan 126 for which a unique measurement of the backscattered electron signal is used) may dictate the granularity or sharpness of profile scan 126. That is, the granularity or sharpness of profile scan 126 increases as a greater quantity of unique measurements of the backscattered electron signal is used to generate profile scan 126.

As further shown in FIG. 1G, the use of high atomic number material 112 increases the contrast between surface 110 of wafer 102 and the surfaces of semiconductor structure 104. The increased contrast enables the scan processing device 124 to perform or determine more accurate critical dimension measurements of semiconductor structure 104 based on profile scan 126. As shown in FIG. 1G, an example critical dimension measurement includes a measurement of the distance between side surfaces 106a and 106b of semiconductor structure 104. The distance between side surfaces 106a and 106b of semiconductor structure 104 may correspond to a thickness of a transistor gate or another type of critical dimension measurement of semiconductor structure 104.

Figure 1H:
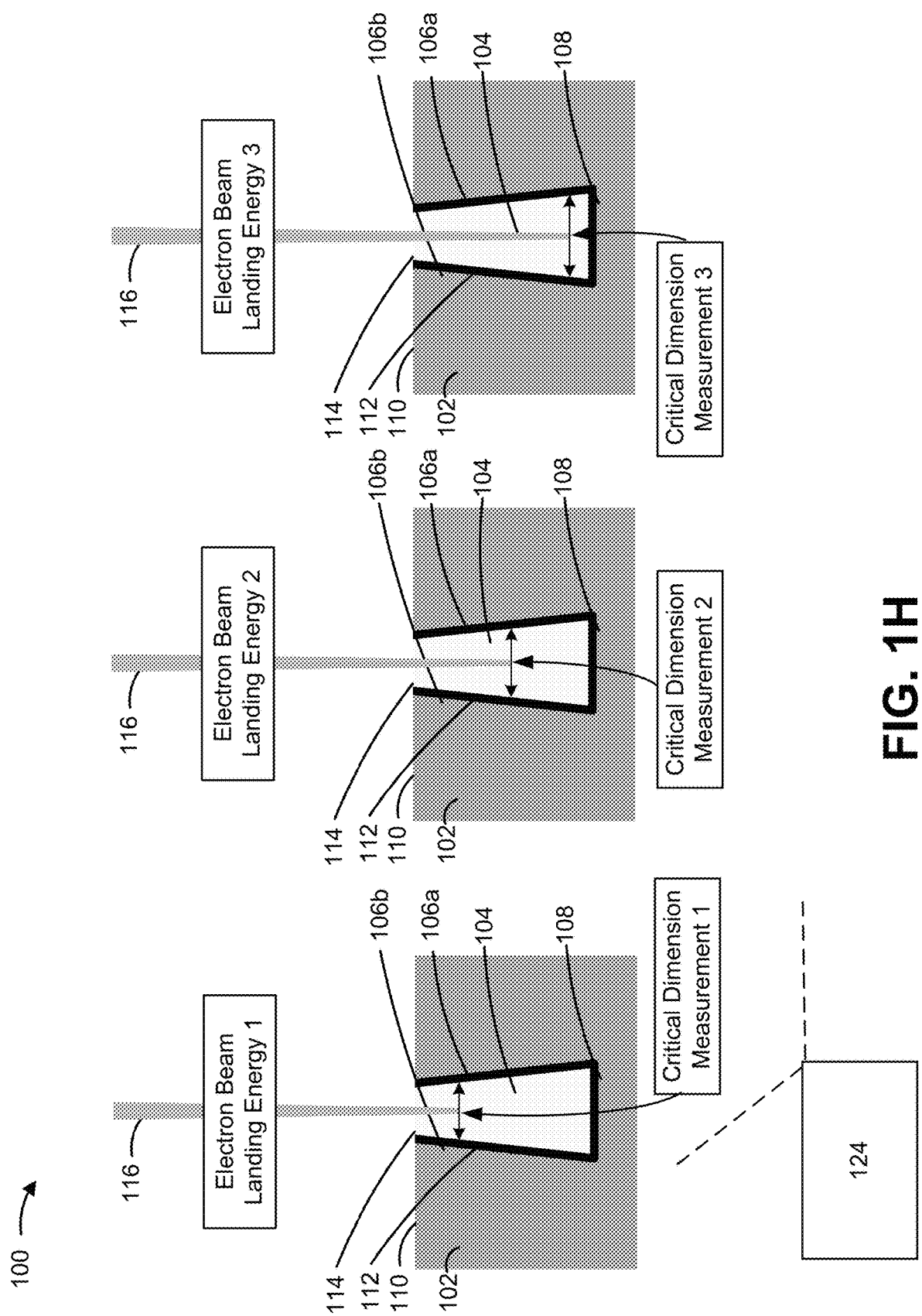

As shown in FIG. 1H, the scan processing device 124 may perform a plurality of critical dimension measurements of semiconductor structure 104 to determine a profile (e.g., a two-dimensional profile or a three-dimensional profile) of semiconductor structure 104. The scan processing device 124 may perform the plurality of critical dimension measurements along one or more directions or axes of semiconductor structure 104, such as in a direction from a top surface of wafer 102 toward a bottom surface of wafer 102, in a direction from the bottom surface of wafer 102 toward the top surface of wafer 102, in a direction from a first side surface of wafer 102 toward a second side surface of wafer 102, in a direction from the second side surface of wafer 102 toward the first side surface of wafer 102, in a direction at a particular angle relative to the top surface of wafer 102, or a direction at a particular angle relative to the bottom surface of wafer 102. In this way, the profile of semiconductor structure 104 may be used to analyze the uniformity of semiconductor structure 104 along one or more surfaces of semiconductor structure 104, may be used to analyze the uniformity of one or more critical dimensions of the semiconductor structure 104, and/or may be used to analyze other parameters of semiconductor structure 104.

As illustrated in the example in FIG. 1H, the scan processing device 124 may determine the profile of semiconductor structure 104 by performing critical dimension measurements at different depths of semiconductor structure 104 in wafer 102. The scan processing device 124 may perform a critical dimension measurement at a particular depth of semiconductor structure 104 based on the landing energy of the incident electrons of electron beam 116 at the depth. For example, the scan processing device 124 may perform a first critical dimension measurement (Critical Dimension Measurement 1) at a first depth of semiconductor structure 104 in wafer 102 based on the landing energy of the incident electrons of electron beam 116 (Electron Beam Landing Energy 1) at the first depth, may perform a second critical dimension measurement (Critical Dimension Measurement 2) at a second depth of semiconductor structure 104 in wafer 102 based on the landing energy of the incident electrons of electron beam 116 (Electron Beam Landing Energy 2) at the second depth, may perform a third critical dimension measurement (Critical Dimension Measurement 3) at a third depth of semiconductor structure 104 in wafer 102 based on the landing energy of the incident electrons of electron beam 116 (Electron Beam Landing Energy 3) at the third depth, and so on. The landing energies at the different depths of the semiconductor device 104 may be used to obtain the profile of the semiconductor structure 104. The scan processing device 124 may perform greater or fewer critical dimension measurements than illustrated in FIG. 1H to determine the profile of semiconductor structure 104.

As indicated above, FIGS. 1A-1H are provided merely as one or more examples. Other examples may differ from what is described with regard to FIGS. 1A-1H.

FIGS. 2A-2E are diagrams of one or more example implementations 200 described herein. As shown in FIGS. 2A-2E, example implementation(s) 200 include various techniques for processing and inspecting a wafer 202 and a semiconductor structure 204 formed therein using a high atomic number material.

Figure 2A:
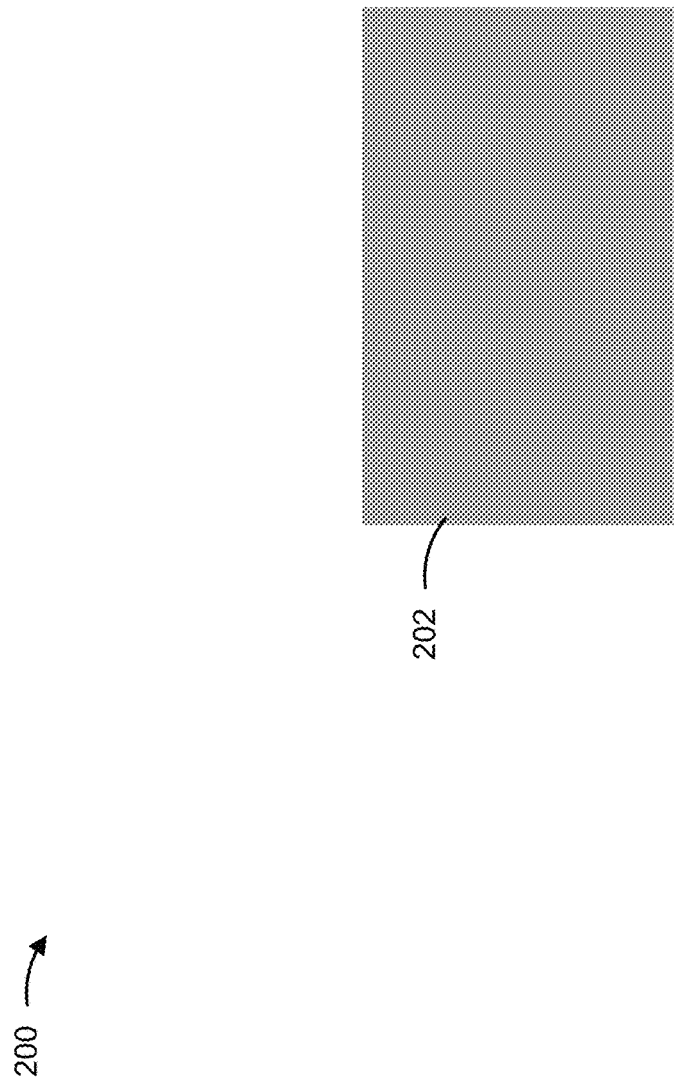
FIGS. 2A-2E are diagrams of one or more example implementations described herein.

Turning to FIG. 2A, wafer 202 may include a wafer formed of various semiconducting, insulating, and/or conductive materials. For example, wafer 202 may be formed of a crystalline silicon, a compound III-V semiconductor material such as GaAs or GaN, and/or other materials. In some implementations, wafer 202 may be referred to as a substrate or another structure on and/or in which a semiconductor structure may be formed.

Figure 2B:
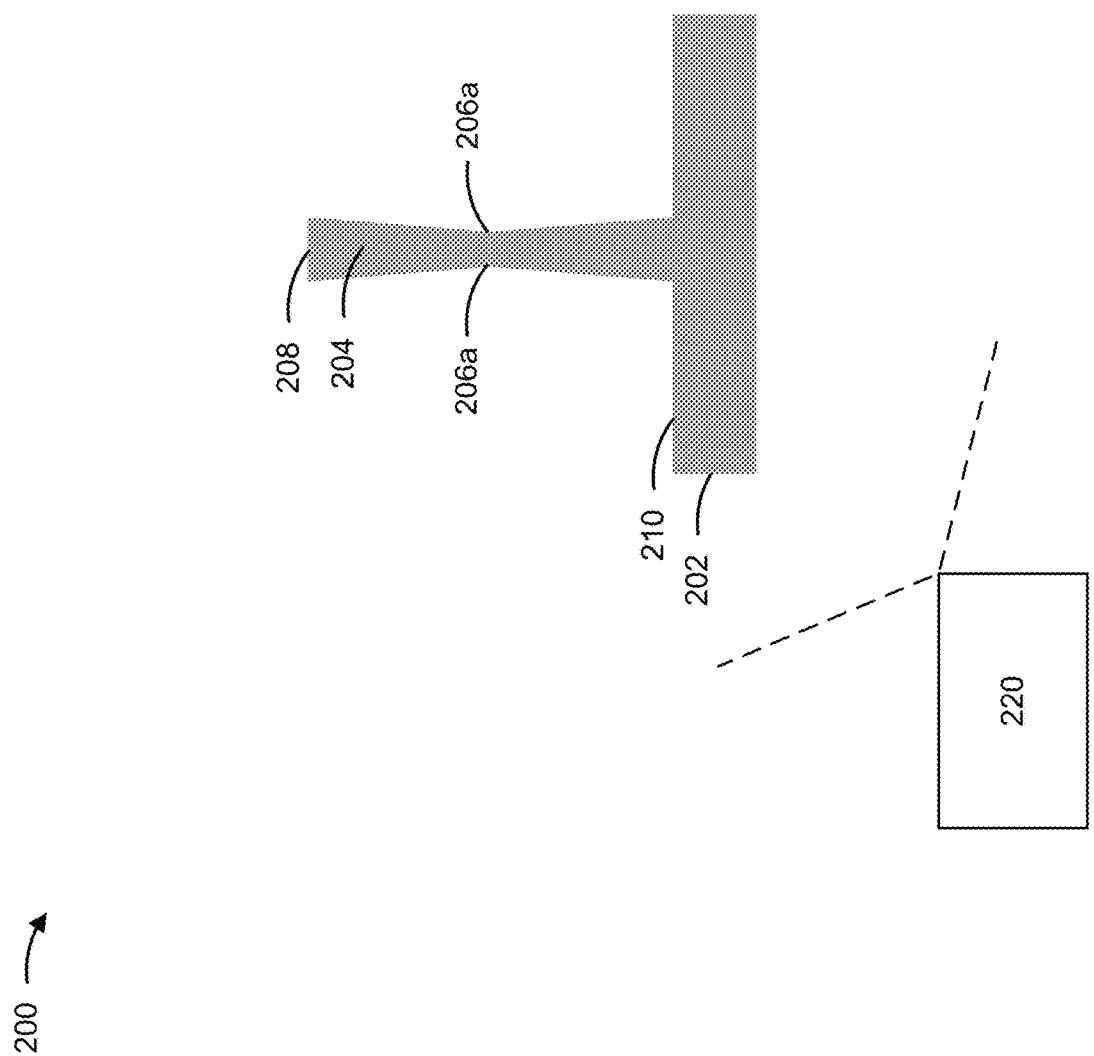

As shown in FIG. 2B, semiconductor structure 204 may be formed on wafer 202. Semiconductor structure 204 may be a semiconductor device such as a transistor; may be a portion of a semiconductor device such as a contact, a transistor gate, a source, or a drain; may be a via, or another type of semiconductor structure. Semiconductor structure 204 may be composed of one or more surfaces. As shown in FIG. 2B, semiconductor structure 204 may include a plurality of surfaces: side surfaces 206a and 206b, and a top surface 208. In the example illustrated in FIG. 2B, semiconductor structure 204 is formed on or above a surface 210 (e.g., a top surface or outer surface) of wafer 202. In this example, surfaces 206a, 206b, and 208 are located above surface 210 of wafer 202, and are therefore at a different depth relative to the depth of surface 210. FIG. 2B illustrates semiconductor structure 204 as a generally rectangular structure that exhibits necking (e.g., where a portion of side surfaces 206a and 206b are tapered due to imperfections in the semiconductor manufacturing process). While semiconductor structure 204 is shown in example implementation(s) 200 as a generally rectangular shape, other semiconductor structures 204 may be formed with a different shape and/or a different quantity and/or configuration of surfaces.

Semiconductor structure 204 may be formed using various semiconductor processing techniques and semiconductor processing devices 220, such as etching from the surface 210 of wafer 202 down to a particular depth within wafer 202. For example, a semiconductor processing device 220 may form, deposit, grow, or otherwise apply a photoresist material to surface 210 of wafer 202, a semiconductor processing device 220 may expose the photoresist to create a patterned photomask, and a semiconductor processing device 220 may etch surface 210 down into wafer 202 to form semiconductor structure 204. In particular, the semiconductor processing device 220 may etch surface 210 around semiconductor structure 204 such that semiconductor structure 204 remains from the etching process, and such that surface 210 is lower than or under semiconductor structure 204. Various etching techniques may be used, such as wet or liquid etching, dry or plasma etching, and/or another etching technique.

Figure 2C:
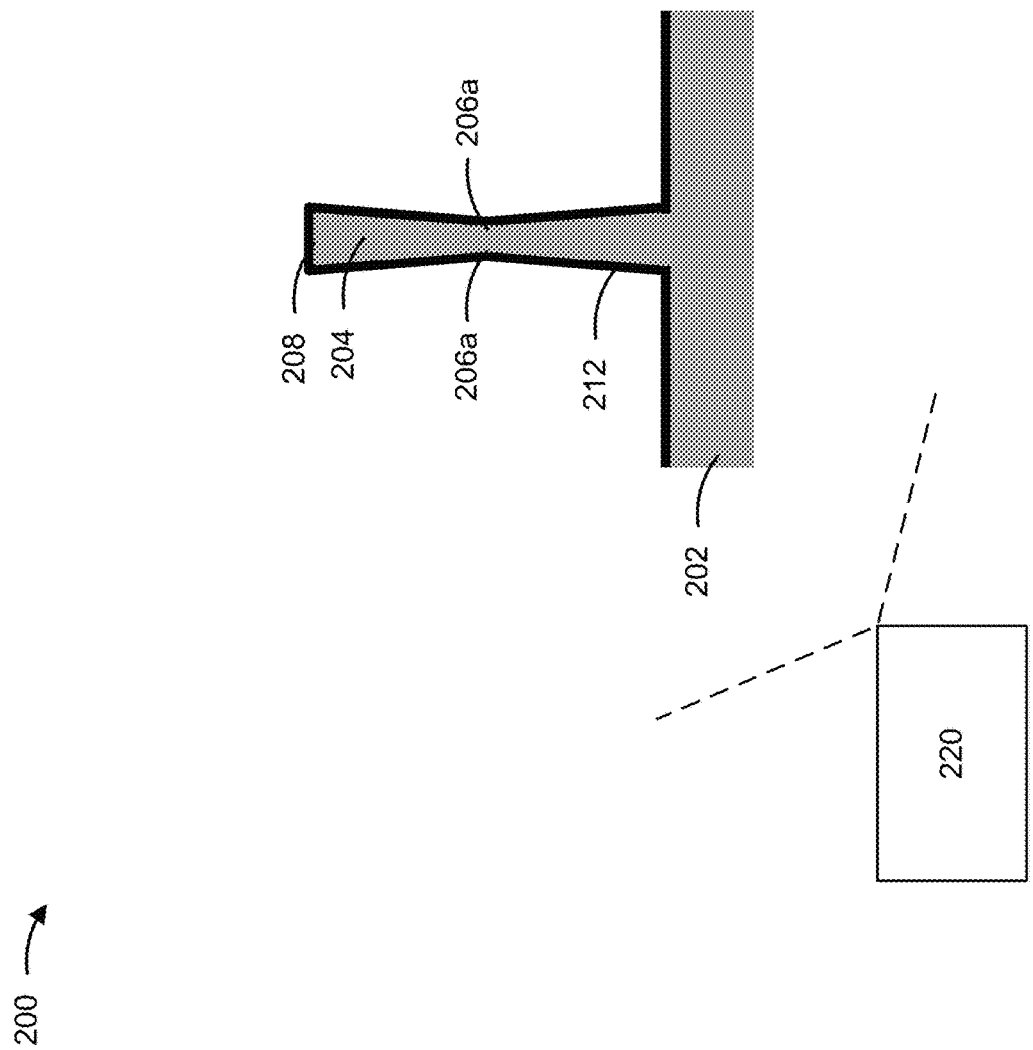

As shown in FIG. 2C, a semiconductor processing device 220 may apply a high atomic number material 212 to at least a portion of wafer 202 such that surfaces 206a, 206b, and 208 of semiconductor structure 204 are coated or covered by high atomic number material 212. In some implementations, a semiconductor processing device 220 deposits high atomic number material 212 as a film to at least a portion of wafer 202 such that the film is deposited on surfaces 206a, 206b, and 208 of semiconductor structure 204. In some implementations, a semiconductor processing device 220 grows high atomic number material 212 on surfaces 206a, 206b, and 208 of semiconductor structure 204 via epitaxy or another growing technique. In some implementations, a semiconductor processing device 220 creates high atomic number material 212 on surfaces 206a, 206b, and 208 of semiconductor structure 204 via ion implantation.

High atomic number material 212 may include a material having a higher or substantially higher atomic number relative to the material of wafer 202, the material of surface 210, and/or the material of surfaces 206a, 206b, and 208. Example high atomic number materials include hafnium (or a hafnium oxide), lanthanum (or a lanthanum oxide), zirconium (or a zirconium oxide), and/or another material having relatively large atoms compared to the material of wafer 202, the material of surface 210, and/or the material of surfaces 206a, 206b, and 208.

The semiconductor processing device 220 may apply high atomic number material 212 to surfaces 206a, 206b, and 208 such that the thickness of high atomic number material 212 is substantially uniform. The uniformity of the thickness of high atomic number material 212 may impact critical dimension measurement of semiconductor structure 204. By applying high atomic number material 212 in a uniform manner, the characteristics of surfaces 206a, 206b, and 208 are preserved, which ensures accurate critical dimension measurement. An example thickness of high atomic number material 212 applied to surfaces 206a, 206b, and 208 is in a range from approximately 1 nanometer (nm) to approximately 2 nm.

In some implementations, the processing steps and/or techniques illustrated and described above in connection with FIGS. 2A-2C are used to form semiconductor structure 204 and/or prepare semiconductor structure 204 for inspection. In some implementations, more processing steps or techniques may be used to form semiconductor structure 204 and/or prepare semiconductor structure 204 for inspection than those illustrated and described above in connection with FIGS. 2A-2C. In some implementations, different steps or techniques than those described above in connection with FIGS. 2A-2C may be used to form semiconductor structure 204 and/or prepare semiconductor structure 204 for inspection.

Figure 2D:
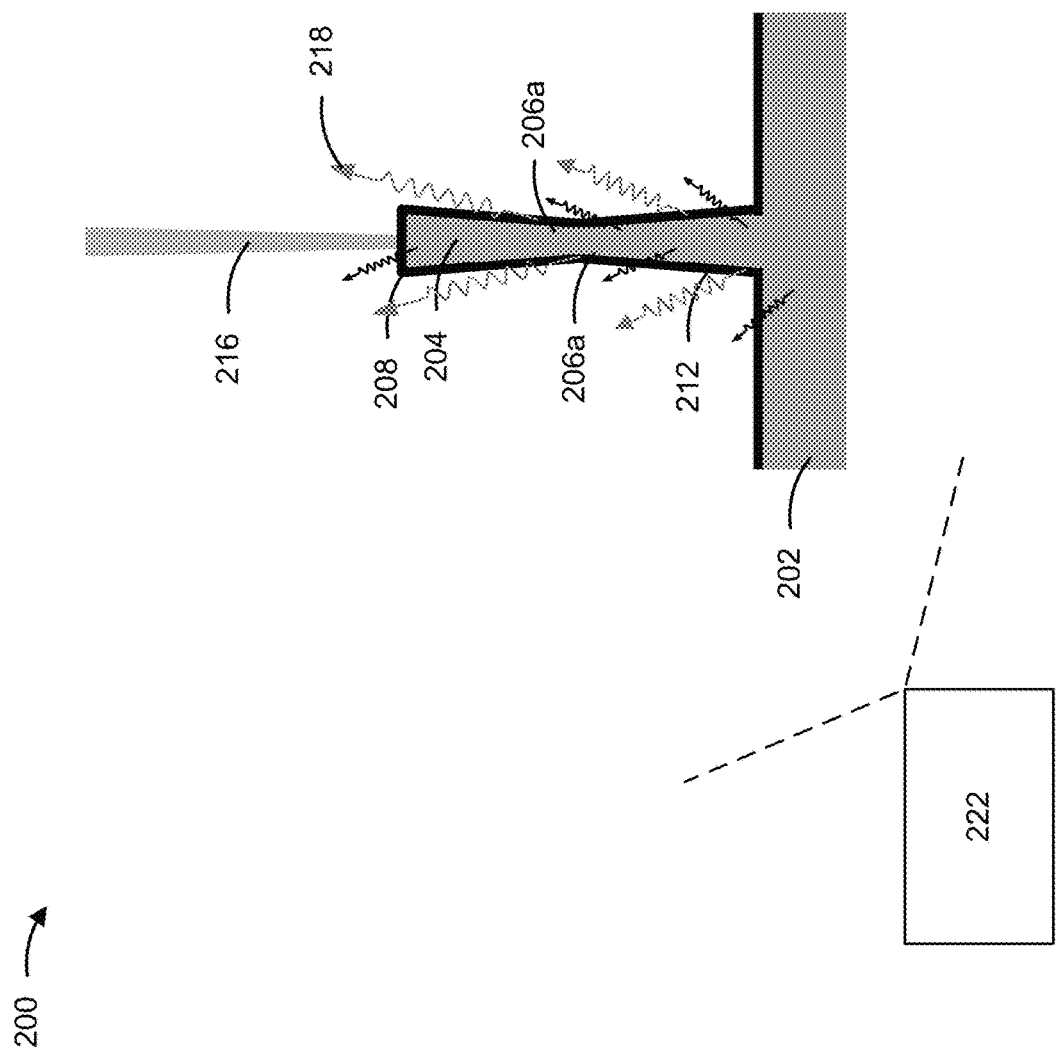

As shown in FIG. 2D, an electron microscope 222 may be used to inspect semiconductor structure 204 after high atomic number material 212 has been applied to semiconductor structure 204. To inspect semiconductor structure 204, the electron microscope 222 may generate and emit an electron beam 216 via an emitter of the electron microscope 222. Electron beam 216 includes a charged and focused electron beam of primary electrons that is directed at wafer 202 and semiconductor structure 204. Electron beam 216 may be directed into a vacuum chamber in which wafer 202 is located, and directed onto wafer 202 and semiconductor structure 204.

As further shown in FIG. 2D, electron beam 216 may contact surface 210 and high atomic number material 212 on surfaces 206a, 206b, and 208. Electron beam 216 may cause backscattered electrons 218 to be emitted from surface 210 and high atomic number material 212 on surfaces 206a, 206b, and 208. Backscattered electrons 218 may form a backscattered electron signal (e.g., a stream or flow of electrons) that is collected at a collector of the electron microscope 222. As further shown in FIG. 2D, high atomic number material 212 emits a higher intensity backscattered electron signal (e.g., emits a greater quantity and/or density of backscattered electrons 218) relative to the materials of wafer 202 and semiconductor structure 204.

Figure 2E:
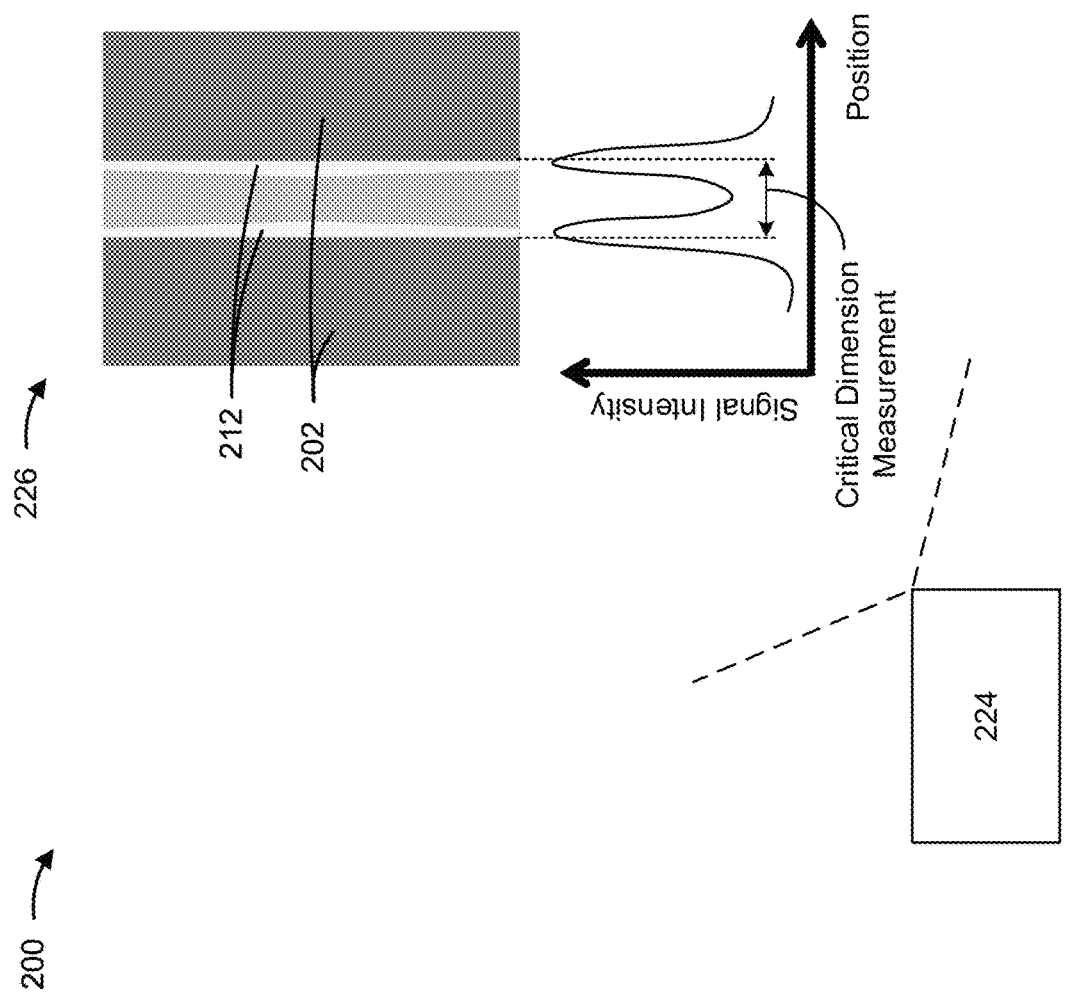

As shown in FIG. 2E, the backscattered electron signal collected at the collector of the electron microscope 222 may be provided to a scan processing device 224. The scan processing device 224 may generate a profile scan 226 or image based on the received backscattered electron signal. Profile scan 226 may be a two-dimensional scan or image or may be a three-dimensional scan or image.

In some implementations, the scan processing device 224 generates profile scan 226 as the electron microscope 222 scans wafer 202 and semiconductor structure 204. The electron microscope 222 may scan wafer 202 and semiconductor structure 204 in a raster pattern or another type of scanning pattern. The scan processing device 224 may generate profile scan 226 in a similar manner. For example, the scan processing device 224 may generate profile scan 226 in the same pattern that is used to scan wafer 202 and semiconductor structure 204 with electron beam 216.

The scan processing device 224 may generate profile scan 226 based on the signal intensity of the backscattered electron signal. For example, the scan processing device 224 may determine a brightness or intensity for each portion of profile scan 226 based on the signal intensity of the backscattered electron signal at a corresponding position of electron beam 216 on wafer 202 or semiconductor structure 204. The pitch of profile scan 226 (e.g., the size of each portion of profile scan 226 for which a unique measurement of the backscattered electron signal is used) may dictate the granularity or sharpness of profile scan 226. That is, the granularity or sharpness of profile scan 226 increases as a greater quantity of unique measurements of the backscattered electron signal is used to generate profile scan 226.

As further shown in FIG. 2E, the use of high atomic number material 212 increases the contrast between surface 210 of wafer 202 and the surfaces of semiconductor structure 204. The increased contrast enables the scan processing device 224 to perform or determine more accurate critical dimension measurements of semiconductor structure 204 based on profile scan 226. As shown in FIG. 2E, an example critical dimension measurement includes a measurement of the distance between side surfaces 206a and 206b of semiconductor structure 204.

In some implementations, the scan processing device 224 performs a plurality of critical dimension measurements of semiconductor structure 204 to determine a profile of semiconductor structure 204. The scan processing device 224 may perform the plurality of critical dimension measurements along one or more directions or axes of semiconductor structure 204, such as in a direction from a top surface of wafer 202 toward a bottom surface of wafer 202, in a direction from the bottom surface of wafer 202 toward the top surface of wafer 202, in a direction from a first side surface of wafer 202 toward a second side surface of wafer 202, in a direction from the second side surface of wafer 202 toward the first side surface of wafer 202, in a direction at a particular angle relative to the top surface of wafer 202, or a direction at a particular angle relative to the bottom surface of wafer 202. In this way, the profile of semiconductor structure 204 may be used to analyze the uniformity of semiconductor structure 204 along one or more surfaces of semiconductor structure 204, may be used to analyze the uniformity of one or more critical dimensions of the semiconductor structure 204, and/or may be used to analyze other parameters of semiconductor structure 204. In particular, the profile of semiconductor structure 204 may be used to determine an amount of necking present in semiconductor structure 204.

As indicated above, FIGS. 2A-2E are provided merely as one or more examples. Other examples may differ from what is described with regard to FIGS. 2A-2E.

Figure 3:
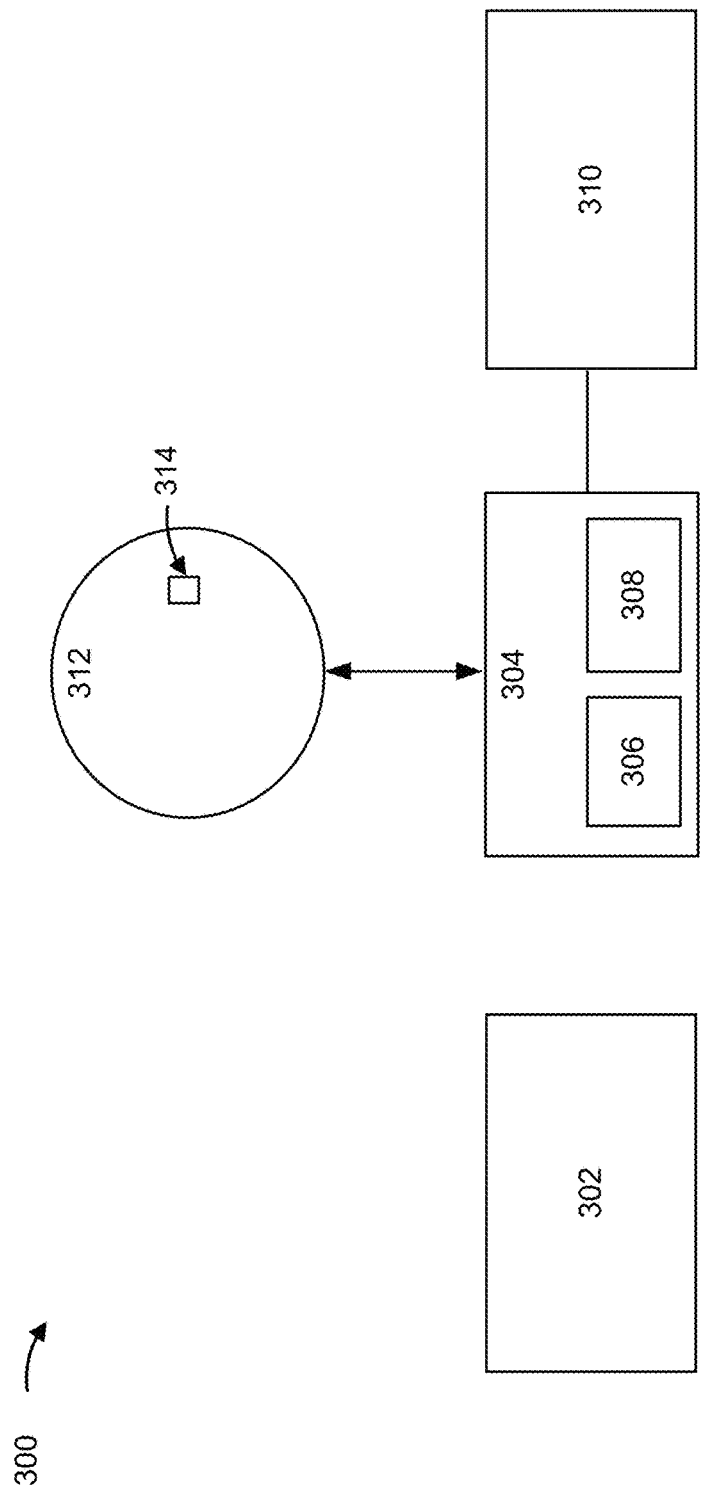
FIG. 3 is a diagram of an example environment in which systems and/or methods described herein may be implemented.

FIG. 3 is a diagram of an example environment 300 in which systems and/or methods described herein may be implemented. As shown in FIG. 3, environment 300 may include a semiconductor processing device 302, an electron microscope 304 that includes an emitter 306 and a collector 308, a scan processing device 310, and a wafer 312. Some devices and/or systems of environment 300 may interconnect via wired connections, wireless connections, or a combination of wired and wireless connections.

Semiconductor processing device 302 includes one or more devices capable of processing wafer 312 using various semiconductor processing techniques to form semiconductor structure 314 (e.g., on wafer 312, above the surface of wafer 312, below or beneath the surface of wafer 312, or a combination thereof). Moreover, semiconductor processing device 302 includes one or more devices capable of applying a high atomic number material on the surface(s) of semiconductor structure 314 to increase backscattered electron signal intensity and/or otherwise enhance electron microscope inspection of semiconductor structure 314.

Semiconductor processing device 302 may be a standalone semiconductor processing device, or may be included in a semiconductor processing system along with other semiconductor processing devices 302 to perform the various semiconductor processing techniques, such as one or more of passivation techniques, photolithography techniques, implantation techniques, etching techniques, deposition techniques, polishing techniques, and/or other techniques. For example, semiconductor processing device 302 may include a surface passivation device or may be included in a surface passivation system, a photoresist or patterning device (e.g., a spin coating device) or may be included in a photoresist or patterning system, a stepper, a deep or extreme ultraviolet exposure device, a wet and/or dry (plasma) etching device, a chemical vapor deposition device, a physical vapor deposition device, a chemical-mechanical polishing device, and/or another type of semiconductor processing device.

Electron microscope 304 includes one or more devices capable of scanning wafer 312 and/or one or more semiconductor structures 314 formed thereon using an electron beam. For example, electron microscope 304 may include a scanning electron microscope, a scanning transmission electron microscope, a transmission electron microscope, a reflection electron microscope, and/or another type of electron microscope. As shown in FIG. 3, electron microscope 304 includes emitter 306 and collector 308. Electron microscope 304 may emit the electron beam using emitter 306, which may be referred to as an electron gun or another type of electron beam emitting device. In some implementations, electron microscope 304 may include one or more lenses and/or reflectors (not shown) that focus and/or direct the electron beam onto wafer 312 and/or semiconductor structure 314.

In some implementations, electron microscope 304 scans wafer 312 and/or semiconductor structure 314 with the electron beam emitted from emitter 306. To scan wafer 312 and/or semiconductor structure 314, electron microscope 304 may move the electron beam along wafer 312 and/or semiconductor structure 314 in a raster scan pattern or another type of scanning pattern. As electron microscope 304 scans wafer 312 and/or semiconductor structure 314, a backscattered electron signal including a plurality of backscattered electrons is emitted from wafer 312 and/or semiconductor structure 314 due to interaction of the electron beam with the atoms of the various materials of wafer 312 and/or semiconductor structure 314. Electron microscope 304 collects the backscattered electron signal using collector 308, which may include a backscattered electron detector or another type of device capable of detecting the backscattered electron signal.

Scan processing device 310 may include a desktop computer, a laptop, a server, a cloud-implemented platform, and/or a similar type of device. Scan processing device 310 may be communicatively connected with electron microscope 304 and may receive an output of the backscattered electron signal from collector 308. In some implementations, scan processing device 310 is a standalone device and is communicatively connected with electron microscope 304 via one or more communications interfaces, a network, and/or a combination thereof. In some implementations, scan processing device 310 is integrated into electron microscope 304 such that scan processing device 310 and electron microscope 304 are a part of the same system.

Scan processing device 310 includes one or more devices and/or systems capable of generating a profile scan or image of wafer 312, semiconductor structure 314, or a portion thereof. The profile scan or image may be a top-down two-dimensional profile scan or image, may be a three-dimensional profile scan or image, or another type of scan and/or image. Scan processing device 310 generates a profile scan or image of semiconductor structure 314 based on the backscattered electron signal received at collector 308. For example, scan processing device 310 may generate portions of the profile scan or image as electron microscope 304 scans the electron beam along semiconductor structure 314 in a pattern. The brightness of each portion of the profile scan or image (and thus, the contrast between portions of the profile scan or image) may be based on the intensity of the backscattered electron signal (e.g., the quantity or density of electrons in the backscattered electron signal) at the corresponding location of the portion of the profile scan or image. In some implementations, scan processing device 310 is capable of generating live video capture of wafer 312 and/or semiconductor structure 314 based on the backscattered electron signal received at collector 308.

Scan processing device 310 may further include one or more devices and/or the systems capable of performing or determining one or more critical dimension measurements of semiconductor structure 314 based on a profile scan or image generated for wafer 312, semiconductor structure 314, or a portion thereof. The critical dimension measurements may include a thickness measurement, a depth measurement, a width measurement, a length measurement, a distance measurement, and/or another type of measurement. For example, scan processing device 310 may determine a width of a transistor gate for a semiconductor device. As another example, scan processing device 310 may determine a thickness of a semiconductor structure 314 that exhibits necking. In some implementations, scan processing device 310 is capable of performing a plurality of critical dimension measurements of a semiconductor structure 314 to determine a profile (e.g., a two-dimensional profile and/or three-dimensional profile) of a semiconductor structure 314.

Wafer 312 may include a semiconductor wafer formed of various semiconducting, insulating, and/or conductive materials. Wafer 312 may be processed (e.g., by one or more semiconductor processing devices 302) such that one or more semiconductor structures 314 are formed thereon. In some implementations, a semiconductor structure 314 includes a semiconductor device, such as a transistor (e.g., a FinFET or other type of transistor), a processor, a memory device, an integrated circuit, and/or another type of semiconductor device. In some implementations, a semiconductor structure 314 includes one or more portions of a semiconductor device, such as a gate (e.g., a transistor gate), a source, a drain, and/or other types of semiconductor features.

The number and arrangement of devices shown in FIG. 3 are provided as one or more examples. In practice, there may be additional devices, fewer devices, different devices, or differently arranged devices than those shown in FIG. 3. Furthermore, two or more devices shown in FIG. 3 may be implemented within a single device, or a single device shown in FIG. 3 may be implemented as multiple, distributed devices. Additionally, or alternatively, a set of devices (e.g., one or more devices) of environment 300 may perform one or more functions described as being performed by another set of devices of environment 300.

Figure 4:
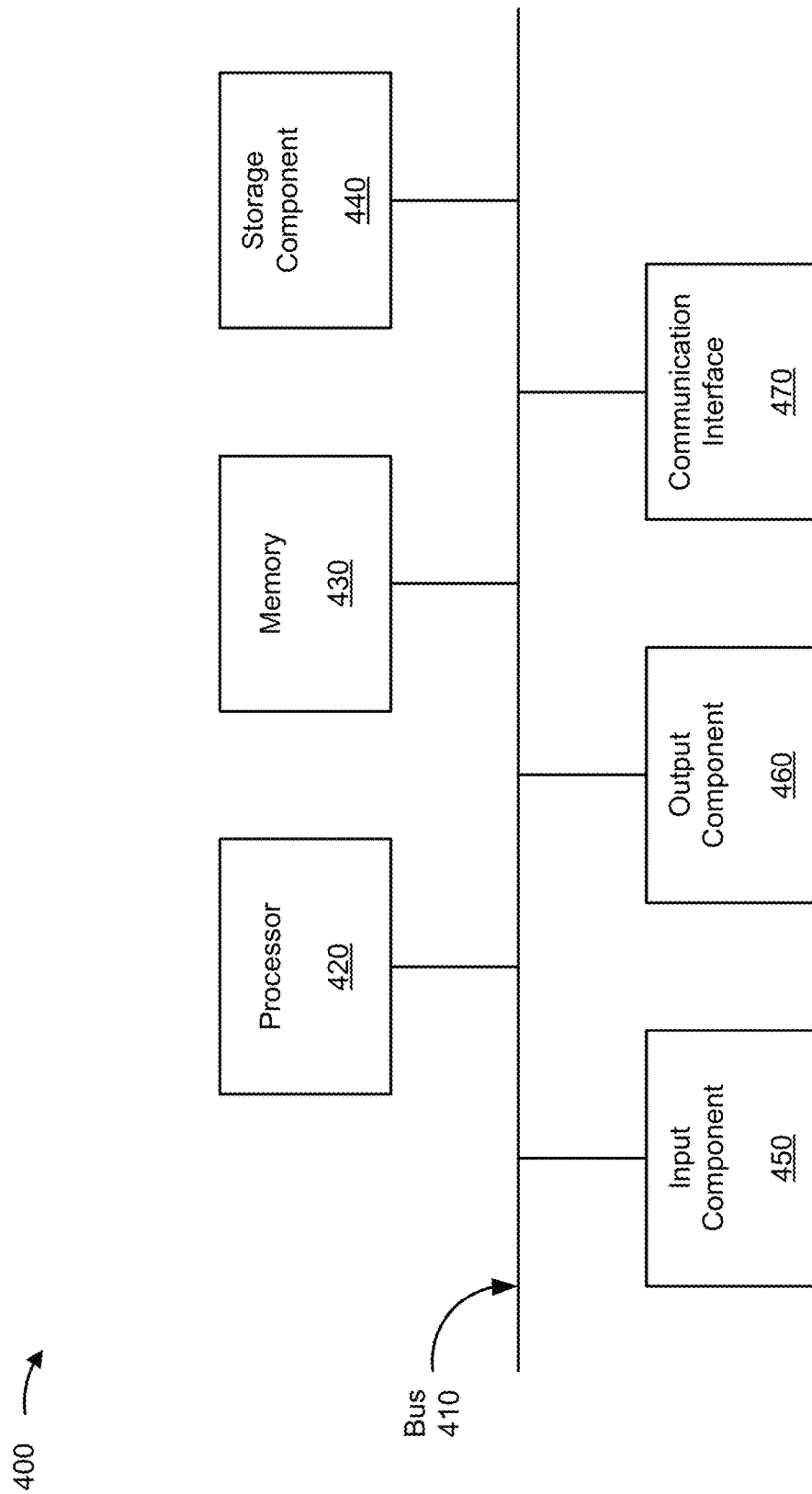
FIG. 4 is a diagram of example components of one or more devices of FIG. 3.

FIG. 4 is a diagram of example components of a device 400. Device 400 may correspond to semiconductor processing device 302, electron microscope 304, emitter 306, collector 308, and/or scan processing device 310. In some implementations, semiconductor processing device 302, electron microscope 304, emitter 306, collector 308, and/or scan processing device 310 may include one or more devices 400 and/or one or more components of device 400. As shown in FIG. 4, device 400 may include a bus 410, a processor 420, a memory 430, a storage component 440, an input component 450, an output component 460, and a communication interface 470.

Bus 410 includes a component that permits communication among multiple components of device 400. Processor 420 is implemented in hardware, firmware, and/or a combination of hardware and software. Processor 420 is a central processing unit (CPU), a graphics processing unit (GPU), an accelerated processing unit (APU), a microprocessor, a microcontroller, a digital signal processor (DSP), a field-programmable gate array (FPGA), an application-specific integrated circuit (ASIC), or another type of processing component. In some implementations, processor 420 includes one or more processors capable of being programmed to perform a function. Memory 430 includes a random access memory (RANI), a read only memory (ROM), and/or another type of dynamic or static storage device (e.g., a flash memory, a magnetic memory, and/or an optical memory) that stores information and/or instructions for use by processor 420.

Storage component 440 stores information and/or software related to the operation and use of device 400. For example, storage component 440 may include a hard disk (e.g., a magnetic disk, an optical disk, and/or a magneto-optic disk), a solid state drive (SSD), a compact disc (CD), a digital versatile disc (DVD), a floppy disk, a cartridge, a magnetic tape, and/or another type of non-transitory computer-readable medium, along with a corresponding drive.

Input component 450 includes a component that permits device 400 to receive information, such as via user input (e.g., a touch screen display, a keyboard, a keypad, a mouse, a button, a switch, and/or a microphone). Additionally, or alternatively, input component 450 may include a component for determining location (e.g., a global positioning system (GPS) component) and/or a sensor (e.g., an accelerometer, a gyroscope, an actuator, or another type of positional or environmental sensor). Output component 460 includes a component that provides output information from device 400 (via, e.g., a display, a speaker, a haptic feedback component, an audio or visual indicator, or another type of output component).

Communication interface 470 includes a transceiver-like component (e.g., a transceiver, a separate receiver, a separate transmitter, or another type of transceiver-like component) that enables device 400 to communicate with other devices, such as via a wired connection, a wireless connection, or a combination of wired and wireless connections. Communication interface 470 may permit device 400 to receive information from another device and/or provide information to another device. For example, communication interface 470 may include an Ethernet interface, an optical interface, a coaxial interface, an infrared interface, a radio frequency (RF) interface, a universal serial bus (USB) interface, a Wi-Fi interface, a cellular network interface, or another communication interface.

Device 400 may perform one or more processes described herein. Device 400 may perform these processes based on processor 420 executing software instructions stored by a non-transitory computer-readable medium, such as memory 430 and/or storage component 440. As used herein, the term "computer-readable medium" refers to a non-transitory memory device. A memory device includes memory space within a single physical storage device or memory space spread across multiple physical storage devices.

Software instructions may be read into memory 430 and/or storage component 440 from another computer-readable medium or from another device via communication interface 470. When executed, software instructions stored in memory 430 and/or storage component 440 may cause processor 420 to perform one or more processes described herein. Additionally, or alternatively, hardware circuitry may be used in place of or in combination with software instructions to perform one or more processes described herein. Thus, implementations described herein are not limited to any specific combination of hardware circuitry and software.

The number and arrangement of components shown in FIG. 4 are provided as an example. In practice, device 400 may include additional components, fewer components, different components, or differently arranged components than those shown in FIG. 4. Additionally, or alternatively, a set of components (e.g., one or more components) of device 400 may perform one or more functions described as being performed by another set of components of device 400.

Figure 5:
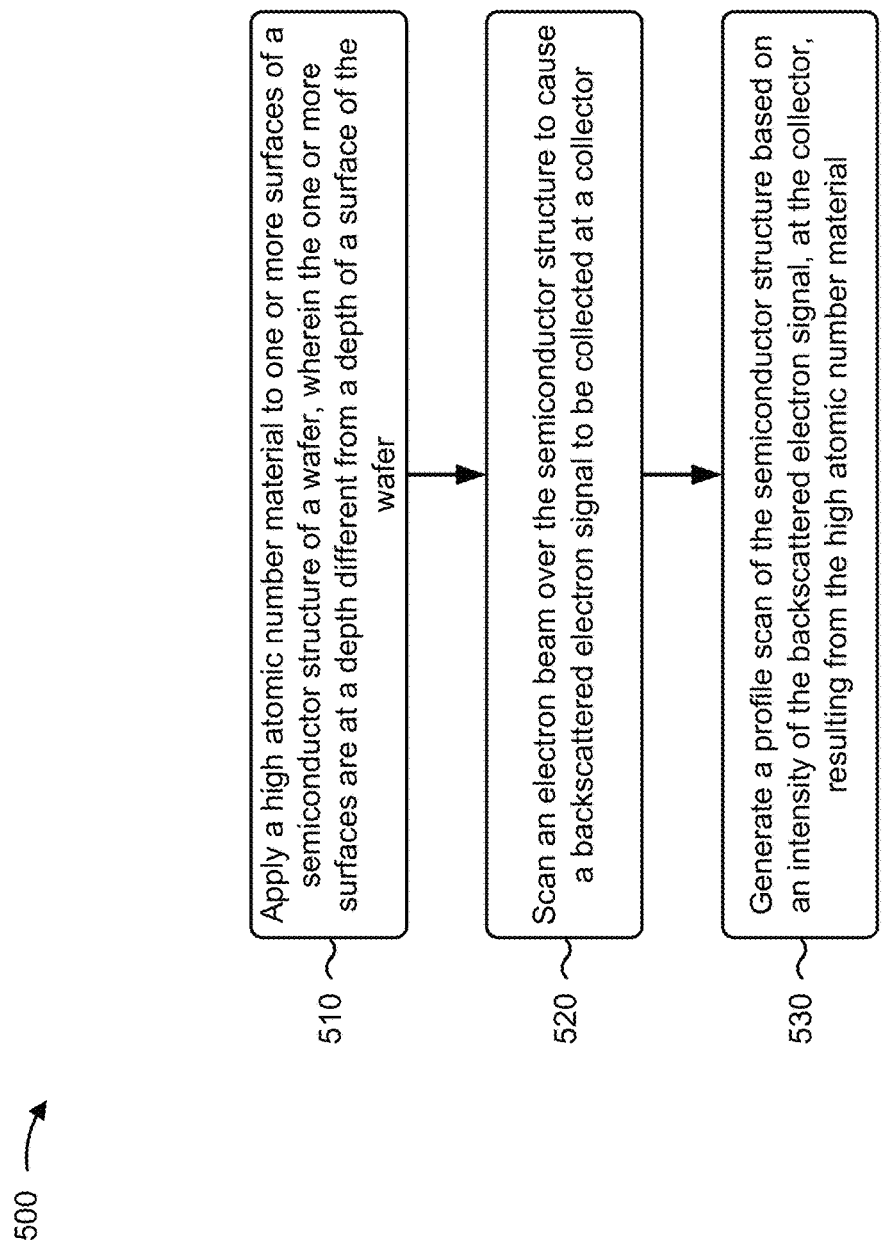
FIGS. 5-7 are flowcharts of example processes for semiconductor structure processing and/or inspection using a high atomic number material.

FIG. 5 is a flow chart of an example process 500 for semiconductor structure inspection using a high atomic number material. In some implementations, one or more process blocks of FIG. 5 is be performed by one or more devices, such as a semiconductor processing device (e.g., semiconductor processing device 302), an electron microscope (e.g., electron microscope 304), a scan processing device (e.g., scan processing device 310), or another device.

As shown in FIG. 5, process 500 may include applying a high atomic number material to one or more surfaces of a semiconductor structure of a wafer, where the one or more surfaces are at a depth different from a depth of a surface of the wafer (block 510). For example, the semiconductor processing device (e.g., using processor 420, memory 430, storage component 440, input component 450, output component 460, or communication interface 470, among other example components) may apply a high atomic number material (e.g., high atomic number material 112, high atomic number material 212) to one or more surfaces (e.g., surfaces 106a, 106b, and/or 108, surfaces 206a, 206b, and/or 208) of a semiconductor structure (e.g., semiconductor structure 104, semiconductor structure 204, and/or the like) of a wafer (e.g., wafer 102, wafer 202), as described above. In some implementations, the one or more surfaces are at a depth different from a depth of a surface (e.g., surface 110, surface 210) of the wafer.

As further shown in FIG. 5, process 500 may include scanning an electron beam over the semiconductor structure to cause a backscattered electron signal to be collected at a collector (block 520). For example, the electron microscope (e.g., using emitter 306, collector 308, processor 420, memory 430, storage component 440, input component 450, output component 460, or communication interface 470, among other example components) may scan an electron beam (e.g., electron beam 116, electron beam 216) over the semiconductor structure to cause a backscattered electron signal of a plurality of backscattered electrons (e.g., backscattered electrons 118, backscattered electrons 218, and/or the like) to be collected at a collector (e.g., collector 308), as described above. In some implementations, the electron beam is emitted from an emitter (e.g., emitter 306) of the electron microscope.

As further shown in FIG. 5, process 500 may include generating a profile scan of the semiconductor structure based on an intensity of the backscattered electron signal, at the collector, resulting from the high atomic number material (block 530). For example, the scan processing device (e.g., using processor 420, memory 430, storage component 440, input component 450, output component 460, or communication interface 470, among other example components) may generate a profile scan (e.g., profile scan 126, profile scan 226) of the semiconductor structure based on an intensity of the backscattered electron signal, at the collector, resulting from the high atomic number material, as described above.

Process 500 may include additional implementations, such as any single implementation or any combination of implementations described below and/or in connection with one or more other processes described elsewhere herein.

In a first implementation, the high atomic number material is hafnium. In a second implementation, alone or in combination with the first implementation, the one or more surfaces of the semiconductor structure are below the surface of the wafer. In a third implementation, alone or in combination with one or more of the first and second implementations, the one or more surfaces of the semiconductor structure are above the surface of the wafer. In a fourth implementation, alone or in combination with one or more of the first through third implementations, applying the high atomic number material to the one or more surfaces of the semiconductor structure of the wafer includes depositing the high atomic number material as a film on the one or more surfaces of the semiconductor structure.

In a fifth implementation, alone or in combination with one or more of the first through fourth implementations, applying the high atomic number material to the one or more surfaces of the semiconductor structure of the wafer includes applying the high atomic number material to one or more side surfaces of the semiconductor structure, and applying the high atomic number material to a bottom surface of the semiconductor structure. In a sixth implementation, alone or in combination with one or more of the first through fifth implementations, applying the high atomic number material to the one or more surfaces of the semiconductor structure of the wafer includes applying the high atomic number material to one or more side surfaces of the semiconductor structure, and applying the high atomic number material to a top surface of the semiconductor structure.

Although FIG. 5 shows example blocks of process 500, in some implementations, process 500 may include additional blocks, fewer blocks, different blocks, or differently arranged blocks than those depicted in FIG. 5. Additionally, or alternatively, two or more of the blocks of process 500 may be performed in parallel.

Figure 6:
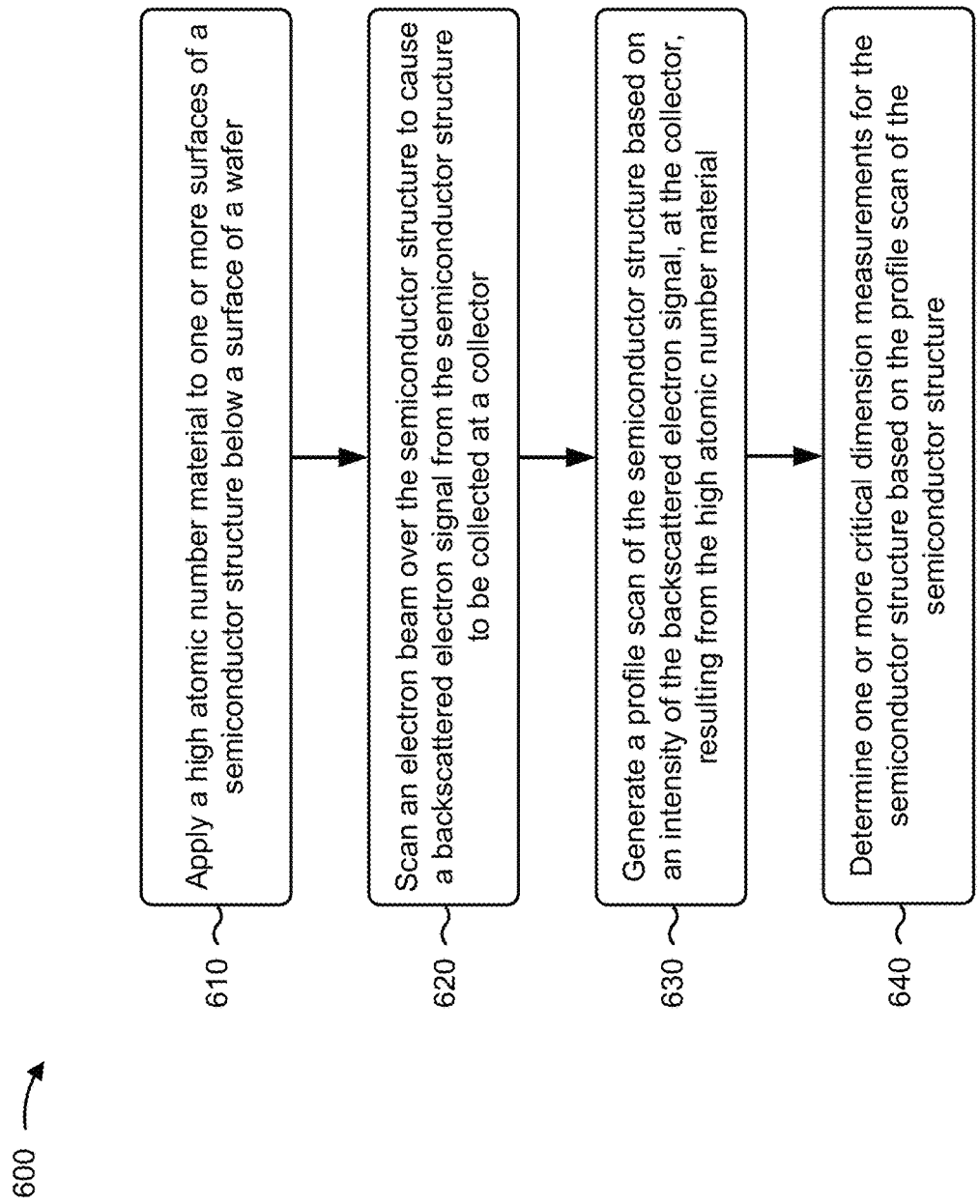

FIG. 6 is a flow chart of an example process 600 for semiconductor structure inspection using a high atomic number material. In some implementations, one or more process blocks of FIG. 6 is be performed by one or more devices, such as a semiconductor processing device (e.g., semiconductor processing device 302), an electron microscope (e.g., electron microscope 304), a scan processing device (e.g., scan processing device 310), and/or another device.

As shown in FIG. 6, process 600 may include applying a high atomic number material to one or more surfaces of a semiconductor structure below a surface of a wafer (block 610). For example, the semiconductor processing device (e.g., using processor 420, memory 430, storage component 440, input component 450, output component 460, or communication interface 470, among other example components) may apply a high atomic number material (e.g., high atomic number material 112, high atomic number material 212) to one or more surfaces (e.g., surfaces 106a, 106b, and/or 108, surfaces 206a, 206b, and/or 208,) of a semiconductor structure (e.g., semiconductor structure 104, semiconductor structure 204) below a surface (e.g., surface 110, surface 210) of a wafer (e.g., wafer 102, wafer 202), as described above.

As further shown in FIG. 6, process 600 may include scanning an electron beam over the semiconductor structure to cause a backscattered electron signal from the semiconductor structure to be collected at a collector (block 620). For example, the electron microscope (e.g., using emitter 306, collector 308, processor 420, memory 430, storage component 440, input component 450, output component 460, or communication interface 470, among other example components) may scan an electron beam (e.g., electron beam 116, electron beam 216, and/or the like) over the semiconductor structure to cause a backscattered electron signal of a plurality of backscattered electrons (e.g., backscattered electrons 118, backscattered electrons 218, and/or the like) from the semiconductor structure to be collected at a collector (e.g., collector 308), as described above. In some implementations, the electron beam is emitted from an emitter (e.g., emitter 306) of the electron microscope.

As further shown in FIG. 6, process 600 may include generating a profile scan of the semiconductor structure based on an intensity of the backscattered electron signal, at the collector, resulting from the high atomic number material (block 630). For example, the scan processing device (e.g., using processor 420, memory 430, storage component 440, input component 450, output component 460, or communication interface 470, among other example components) may generate a profile scan (e.g., profile scan 126, profile scan 226) of the semiconductor structure based on an intensity of the backscattered electron signal, at the collector, resulting from the high atomic number material, as described above.

As further shown in FIG. 6, process 600 may include determining one or more critical dimension measurements for the semiconductor structure based on the profile scan of the semiconductor structure (block 640). For example, the scan processing device (e.g., using processor 420, memory 430, storage component 440, input component 450, output component 460, or communication interface 470, among other example components) may determine one or more critical dimension measurements for the semiconductor structure based on the profile scan of the semiconductor structure, as described above.

Process 600 may include additional implementations, such as any single implementation or any combination of implementations described below and/or in connection with one or more other processes described elsewhere herein.

In a first implementation, an atomic number of the high atomic number material is greater relative to an atomic number of a material of the semiconductor structure. In a second implementation, alone or in combination with the first implementation, the high atomic number material is hafnium. In a third implementation, alone or in combination with one or more of the first and second implementations, the high atomic number material is lanthanum. In a fourth implementation, alone or in combination with one or more of the first through third implementations, the semiconductor structure is an inverted trapezoid structure.

In a fifth implementation, alone or in combination with one or more of the first through fourth implementations, determining one or more critical dimension measurements for the semiconductor structure includes determining respective critical dimension measurements at different depths of the semiconductor structure below the surface of the wafer. In a sixth implementation, alone or in combination with one or more of the first through fifth implementations, determining the respective critical dimension measurements at the different depths of the semiconductor structure includes determining a first critical dimension measurement at a first depth of the semiconductor structure based on a landing energy of incident electrons of the electron beam at the first depth, and determining a second critical dimension measurement at a second depth of the semiconductor structure based on a landing energy of incident electrons of the electron beam at the second depth.

Although FIG. 6 shows example blocks of process 600, in some implementations, process 600 may include additional blocks, fewer blocks, different blocks, or differently arranged blocks than those depicted in FIG. 6. Additionally, or alternatively, two or more of the blocks of process 600 may be performed in parallel.

Figure 7:
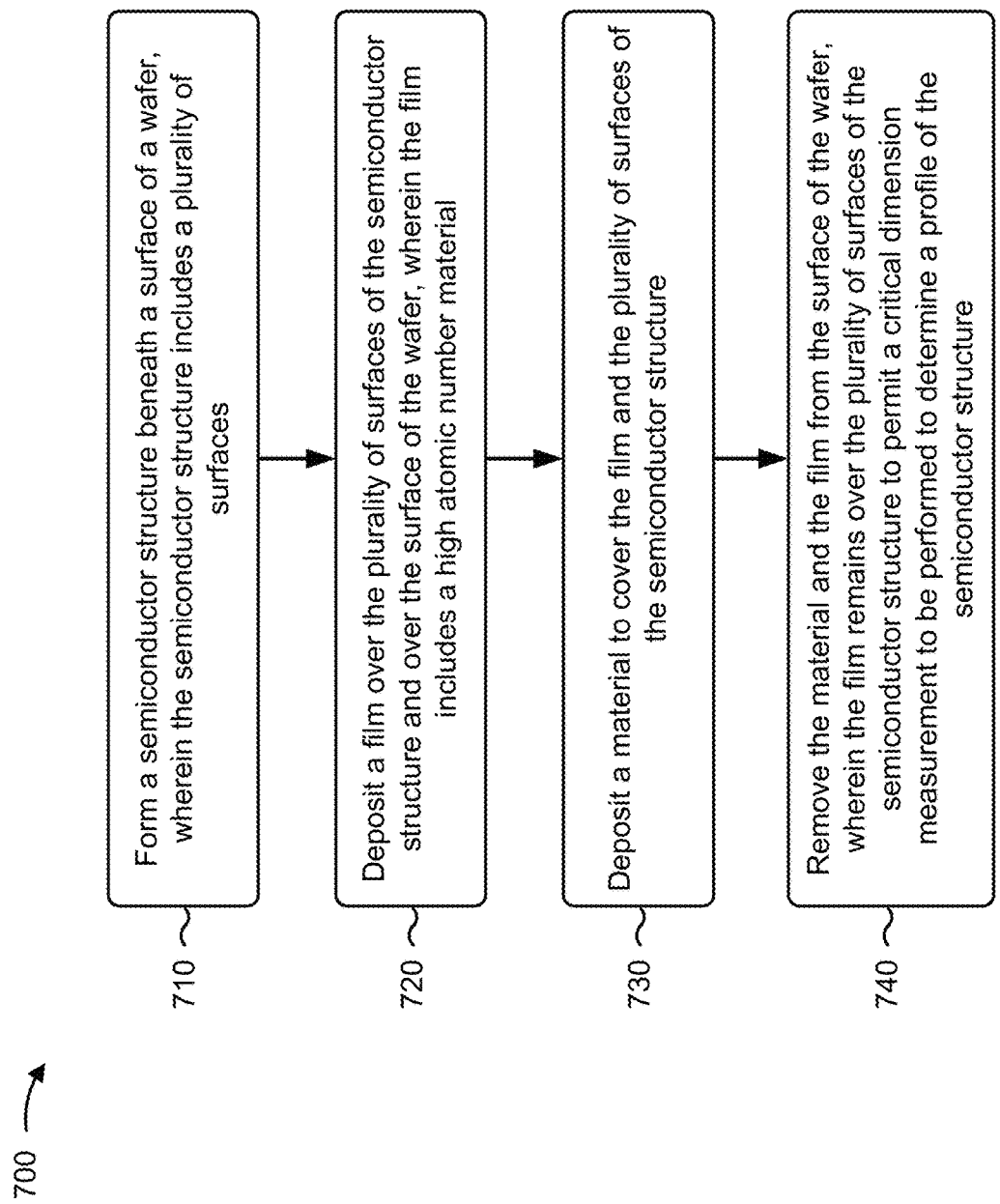

FIG. 7 is a flow chart of an example process 700 for processing a semiconductor structure for inspection using a high atomic number material. In some implementations, one or more process blocks of FIG. 7 is be performed by a semiconductor processing device (e.g., semiconductor processing device 302). In some implementations, one or more steps process 700 may be performed by one or more devices other than the semiconductor processing device, such as an electron microscope (e.g., electron microscope 304), a scan processing device (e.g., scan processing device 310), and/or another device.

As shown in FIG. 7, process 700 may include forming a semiconductor structure beneath a surface of a wafer, where the semiconductor structure includes a plurality of surfaces (block 710). For example, the semiconductor processing device (e.g., using processor 420, memory 430, storage component 440, input component 450, output component 460, or communication interface 470, among other example components) may form a semiconductor structure (e.g., semiconductor structure 104, semiconductor structure 204) beneath a surface (e.g., surface 110, surface 210) of a wafer (e.g., wafer 102, wafer 202), as described above. In some implementations, the semiconductor structure includes a plurality of surfaces (e.g., surfaces 106a, 106b, and/or 108, surfaces 206a, 206b, and/or 208).

As further shown in FIG. 7, process 700 may include depositing a film over the plurality of surfaces of the semiconductor structure and over the surface of the wafer, where the film includes a high atomic number material (block 720). For example, the semiconductor processing device (e.g., using emitter 306, collector 308, processor 420, memory 430, storage component 440, input component 450, output component 460, or communication interface 470, among other example components) may deposit a film over the plurality of surfaces of the semiconductor structure and over the surface of the wafer, as described above. In some implementations, the film includes a high atomic number material (e.g., high atomic number material 112, high atomic number material 212).

As further shown in FIG. 7, process 700 may include depositing a material to cover the film and the plurality of surfaces of the semiconductor structure (block 730). For example, the semiconductor processing device (e.g., using processor 420, memory 430, storage component 440, input component 450, output component 460, or communication interface 470, among other example components) may deposit a material (e.g., material 144) to cover the film and the plurality of surfaces of the semiconductor structure, as described above.

As further shown in FIG. 7, process 700 may include removing the material and the film from the surface of the wafer, where the film remains over the plurality of surfaces of the semiconductor structure to permit a critical dimension measurement to be performed to determine a profile of the semiconductor structure (block 740). For example, the semiconductor processing device (e.g., using processor 420, memory 430, storage component 440, input component 450, output component 460, or communication interface 470, among other example components) may remove the material and the film from the surface of the wafer, as described above. In some implementations, the film remains over the plurality of surfaces of the semiconductor structure to permit a critical dimension measurement to be performed to determine a profile of the semiconductor structure.

Process 700 may include additional implementations, such as any single implementation or any combination of implementations described below and/or in connection with one or more other processes described elsewhere herein.

In a first implementation, process 700 includes inspecting the semiconductor structure using a scanning electron microscope to generate an image of the semiconductor structure, where the film is increasing contrast, in the image, between the surface of the wafer and the plurality of surfaces of the semiconductor structure. In a second implementation, alone or in combination with the first implementation, process 700 includes performing the critical dimension measurement of the semiconductor structure based on the image. In a third implementation, alone or in combination with one or more of the first and second implementations, performing the critical dimension measurement of the semiconductor structure includes performing a plurality of critical dimension measurements of the semiconductor structure at different depths of the wafer to determine the profile of the semiconductor structure and using different landing energies for the different depths of the wafer to determine the profile of the semiconductor structure.

In a fourth implementation, alone or in combination with one or more of the first through third implementations, the semiconductor structure is a transistor gate structure, and performing the critical dimension measurement of the semiconductor structure includes determining a width of the transistor gate structure based on the image. In a fifth implementation, alone or in combination with one or more of the first through fourth implementations, depositing the film over the plurality of surfaces of the semiconductor structure includes depositing the film at a near uniform thickness over the plurality of surfaces of the semiconductor structure.

Although FIG. 7 shows example blocks of process 700, in some implementations, process 700 may include additional blocks, fewer blocks, different blocks, or differently arranged blocks than those depicted in FIG. 7. Additionally, or alternatively, two or more of the blocks of process 700 may be performed in parallel.

In this way, a semiconductor structure is formed on a wafer such that a surface of the semiconductor structure is at a different depth relative to a depth of a surface of the wafer. For example, the semiconductor structure may be formed beneath the surface of the wafer, above the surface of the wafer, or formed partially above and partially below the surface of the wafer. The semiconductor structure is further processed to apply a high atomic number material on the surface of the semiconductor structure. The high atomic number material is made up of relatively larger atoms compared to the material(s) of the surfaces of the wafer and the semiconductor structure. The larger atoms of the high atomic number material more easily scatter electrons relative to the material(s) of the surfaces of the wafer and the semiconductor structure, which produces a higher intensity backscattered electron signal relative to the material(s) of the surfaces of the wafer and the semiconductor structure. The higher intensity backscattered electron signal produces an increased brightness and/or higher contrast in electron microscope scans or images than if no high atomic number material were used. In this way, the scans or images may be used for more accurate critical dimension measurement, may be used for critical dimension measurement of a semiconductor structure beneath and/or above the surface of the wafer, and/or may be used for analysis of gray level profiles of a semiconductor structure to define pattern dimensions.

As described in greater detail above, some implementations described herein provide a method. The method includes applying a high atomic number material to one or more surfaces of a semiconductor structure of a wafer. The one or more surfaces are at a depth different from a depth of a surface of the wafer. The method includes scanning an electron beam over the semiconductor structure to cause a backscattered electron signal to be collected at a collector. The method includes generating a profile scan of the semiconductor structure based on an intensity of the backscattered electron signal, at the collector, resulting from the high atomic number material.

As described in greater detail above, some implementations described herein provide a method. The method includes applying a high atomic number material to one or more surfaces of a semiconductor structure below a surface of a wafer. The method includes scanning an electron beam over the semiconductor structure to cause a backscattered electron signal from the semiconductor structure to be collected at a collector. The method includes generating a profile scan of the semiconductor structure based on an intensity of the backscattered electron signal, at the collector, resulting from the high atomic number material. The method includes determining one or more critical dimension measurements for the semiconductor structure based on the profile scan of the semiconductor structure.

As described in greater detail above, some implementations described herein provide a method. The method includes forming a semiconductor structure beneath a surface of a wafer. The semiconductor structure includes a plurality of surfaces. The method includes depositing a film over the plurality of surfaces of the semiconductor structure and over the surface of the wafer. The film includes a high atomic number material. The method includes depositing a material to cover the film and the plurality of surfaces of the semiconductor structure. The method includes removing the material and the film from the surface of the wafer. The film remains over the plurality of surfaces of the semiconductor structure to permit a critical dimension measurement to be performed to determine a profile of the semiconductor structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the implementations introduced herein. Those skilled in the art should also realize that such equivalent constructions do not depart from the spirit and scope of the present disclosure, and that those skilled in the art may make various changes, substitutions, and alterations herein without departing from the spirit and scope of the present disclosure.

What is claimed is:

1. A method, comprising:
applying a high atomic number material to one or more surfaces of a semiconductor structure of a wafer,
wherein the one or more surfaces are at a depth different from a depth of a surface of the wafer, and
wherein the semiconductor structure is an inverted trapezoid structure;
scanning an electron beam over the semiconductor structure to cause a backscattered electron signal to be collected at a collector; and
generating a profile scan of the semiconductor structure based on an intensity of the backscattered electron signal, at the collector, resulting from the high atomic number material,
wherein at least one of:
the one or more surfaces of the semiconductor structure are below the surface of the wafer, or
the high atomic number material is applied to at least one of:
one or more side surfaces of the one or more surfaces of the semiconductor structure,
a bottom surface of the one or more surfaces of the semiconductor structure, or
a top surface of the one or more surfaces of the semiconductor structure.

2. The method of claim 1, wherein the high atomic number material is hafnium.

3. The method of claim 1, wherein the one or more surfaces of the semiconductor structure are below the surface of the wafer.

4. The method of claim 1, wherein the one or more surfaces of the semiconductor structure are above the surface of the wafer.

5. The method of claim 1, wherein applying the high atomic number material to the one or more surfaces of the semiconductor structure of the wafer comprises:
depositing the high atomic number material as a film on the one or more surfaces of the semiconductor structure.

6. The method of claim 1, wherein applying the high atomic number material to the one or more surfaces of the semiconductor structure of the wafer comprises:
applying the high atomic number material to the one or more side surfaces of the one or more surfaces of the semiconductor structure, and
applying the high atomic number material to the bottom surface of the one or more surfaces of the semiconductor structure.

7. The method of claim 1, wherein applying the high atomic number material to the one or more surfaces of the semiconductor structure of the wafer comprises:
applying the high atomic number material to the one or more side surfaces of the one or more surfaces of the semiconductor structure, and
applying the high atomic number material to the top surface of the one or more surfaces of the semiconductor structure.

8. A method, comprising:
applying a high atomic number material to one or more surfaces of a semiconductor structure below a surface of a wafer;
scanning an electron beam over the semiconductor structure to cause a backscattered electron signal from the semiconductor structure to be collected at a collector;
generating a profile scan of the semiconductor structure based on an intensity of the backscattered electron signal, at the collector, resulting from the high atomic number material; and
determining respective critical dimension measurements at different depths of the semiconductor structure based on the profile scan of the semiconductor structure.

9. The method of claim 8, wherein an atomic number of the high atomic number material is greater relative to an atomic number of a material of the semiconductor structure.

10. The method of claim 8, wherein the high atomic number material is hafnium.

11. The method of claim 8, wherein the high atomic number material is lanthanum.

12. The method of claim 8, wherein the semiconductor structure is an inverted trapezoid structure.

13. The method of claim 8, wherein at least one of the different depths of the semiconductor structure are below the surface of the wafer.

14. The method of claim 8, wherein determining the respective critical dimension measurements at the different depths of the semiconductor structure comprises:
determining a first critical dimension measurement at a first depth of the semiconductor structure based on a landing energy of incident electrons of the electron beam at the first depth; and
determining a second critical dimension measurement at a second depth of the semiconductor structure based on a landing energy of incident electrons of the electron beam at the second depth.

15. The method of claim 8, wherein applying the high atomic number material to the one or more surfaces of the semiconductor structure of the wafer comprises:
depositing the high atomic number material as a film on the one or more surfaces of the semiconductor structure.

16. A method, comprising:
forming a semiconductor structure beneath a surface of a wafer,
wherein the semiconductor structure includes a plurality of surfaces;
depositing a film over the plurality of surfaces of the semiconductor structure and over the surface of the wafer,
wherein the film includes a high atomic number material;
depositing a material to cover the film and the plurality of surfaces of the semiconductor structure;
removing the material and the film from the surface of the wafer,
wherein the film remains over the plurality of surfaces of the semiconductor structure to permit a critical dimension measurement to be performed to determine a profile of the semiconductor structure; and
inspecting the semiconductor structure using a scanning electron microscope to generate an image of the semiconductor structure,
wherein the film increases contrast, in the image, between the surface of the wafer and the plurality of surfaces of the semiconductor structure.

17. The method of claim 16, further comprising:
performing the critical dimension measurement of the semiconductor structure based on the image.

18. The method of claim 17, wherein performing the critical dimension measurement of the semiconductor structure comprises:

performing a plurality of critical dimension measurements of the semiconductor structure at different depths of the wafer; and using different landing energies for the different depths of the wafer to determine the profile of the semiconductor structure.

19. The method of claim 17, wherein the semiconductor structure is a transistor gate structure; and wherein performing the critical dimension measurement of the semiconductor structure comprises:

determining a width of the transistor gate structure based on the image.

20. The method of claim 16, wherein depositing the film over the plurality of surfaces of the semiconductor structure comprises:

depositing the film at a substantially uniform thickness over the plurality of surfaces of the semiconductor structure.

\* \* \* \* \*